United States Patent
Lilak et al.

(10) Patent No.: US 11,075,119 B2
(45) Date of Patent: Jul. 27, 2021

(54) VERTICALLY STACKED TRANSISTORS IN A FIN

(71) Applicant: Intel Corporation, Santa Clara, CA (US)

(72) Inventors: Aaron D. Lilak, Beaverton, OR (US); Sean T. Ma, Portland, OR (US); Justin R. Weber, Hillsboro, OR (US); Patrick Morrow, Portland, OR (US); Rishabh Mehandru, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/475,032

(22) PCT Filed: Mar. 30, 2017

(86) PCT No.: PCT/US2017/025004
§ 371 (c)(1),
(2) Date: Jun. 28, 2019

(87) PCT Pub. No.: WO2018/182615
PCT Pub. Date: Oct. 4, 2018

(65) Prior Publication Data
US 2019/0326175 A1    Oct. 24, 2019

(51) Int. Cl.
*H01L 21/822* (2006.01)
*H01L 21/02* (2006.01)
*H01L 21/225* (2006.01)
*H01L 21/265* (2006.01)
*H01L 21/683* (2006.01)
(Continued)

(52) U.S. Cl.
CPC ...... *H01L 21/8221* (2013.01); *H01L 21/0217* (2013.01); *H01L 21/02178* (2013.01); *H01L 21/2252* (2013.01); *H01L 21/26533* (2013.01); *H01L 21/6835* (2013.01); *H01L 21/762* (2013.01); *H01L 21/823431* (2013.01); *H01L 21/823437* (2013.01); *H01L 21/823481* (2013.01); *H01L 27/0886* (2013.01); *H01L 29/167* (2013.01); *H01L 29/401* (2013.01);
(Continued)

(58) Field of Classification Search
CPC .................................................. H01L 21/8221
See application file for complete search history.

(56) References Cited

U.S. PATENT DOCUMENTS 6,413,802 B1    7/2002 Hu et al.
6,974,983 B1 *  12/2005 Hill ........................ H01L 21/845
                                                       257/292

(Continued)

FOREIGN PATENT DOCUMENTS

WO    2007085996    8/2007

OTHER PUBLICATIONS

Partial Supplementary European Search Report from European Patent Application No. 17902648.9 dated Jun. 12, 2020, 14 pgs.
(Continued)

*Primary Examiner* — William A Harriston
(74) *Attorney, Agent, or Firm* — Green, Howard & Mughal LLP

(57) ABSTRACT

An apparatus is provided which comprises: a fin; a layer formed on the fin, the layer dividing the fin in a first section and a second section; a first device formed on the first section of the fin; and a second device formed on the second section of the fin.

19 Claims, 24 Drawing Sheets

(51) Int. Cl.
*H01L 21/762* (2006.01)
*H01L 21/8234* (2006.01)
*H01L 27/088* (2006.01)
*H01L 29/167* (2006.01)
*H01L 29/40* (2006.01)
*H01L 29/66* (2006.01)

(52) U.S. Cl.
CPC .......................... *H01L 29/66545* (2013.01); *H01L 2221/6835* (2013.01)

(56) References Cited

U.S. PATENT DOCUMENTS

| | | | |
|---|---|---|---|
| 9,356,027 B1* | 5/2016 | Cheng | H01L 21/823807 |
| 9,837,414 B1* | 12/2017 | Balakrishnan | H01L 21/823871 |
| 2004/0145000 A1* | 7/2004 | An | H01L 29/66545 257/270 |
| 2004/0192009 A1 | 9/2004 | Belyansky et al. | |
| 2006/0289940 A1 | 12/2006 | Hyun et al. | |
| 2007/0045679 A1 | 3/2007 | McKee et al. | |
| 2008/0128787 A1 | 6/2008 | Kato | |
| 2008/0135935 A1* | 6/2008 | Cho | H01L 29/41791 257/347 |
| 2009/0072316 A1* | 3/2009 | Topaloglu | H01L 29/78648 257/365 |
| 2012/0052618 A1 | 3/2012 | Inns | |
| 2012/0161226 A1 | 6/2012 | Darwish | |
| 2013/0102137 A1 | 4/2013 | Jeng | |
| 2013/0214357 A1* | 8/2013 | Chang | H01L 29/66545 257/347 |
| 2015/0162404 A1 | 6/2015 | Yang et al. | |
| 2016/0005738 A1* | 1/2016 | Liu | H01L 27/0924 257/369 |
| 2016/0005852 A1* | 1/2016 | Kim | H01L 27/1211 257/401 |
| 2016/0056181 A1 | 2/2016 | Anderson et al. | |
| 2017/0133461 A1* | 5/2017 | Hafez | H01L 29/66803 |
| 2017/0317187 A1* | 11/2017 | Gardner | H01L 29/66795 |
| 2017/0338334 A1* | 11/2017 | Cheng | H01L 21/26506 |
| 2020/0212038 A1* | 7/2020 | Rachmady | H01L 21/823842 |
| 2020/0279916 A1* | 9/2020 | Rachmady | H01L 29/775 |
| 2020/0312958 A1* | 10/2020 | Murthy | H01L 29/0847 |
| 2020/0411511 A1* | 12/2020 | Rachmady | H01L 29/66545 |

OTHER PUBLICATIONS

Chan, Philip C. et al., "Three-Dimensional Stacked-Fin-CMOS Integrated Circuit Using Double Layer SOI Material", IEEE 2004, 6 pgs.

International Preliminary Report on Patentability from PCT/US2017/025004 dated Oct. 10, 2019, 11 pgs.

International Search Report and Written Opinion from PCT/US2017/025004 dated Dec. 22, 2017, 16 pgs.

Extended European Search Report from European Patent Application No. 17902648.9 dated Sep. 11, 2020, 12 pgs.

* cited by examiner

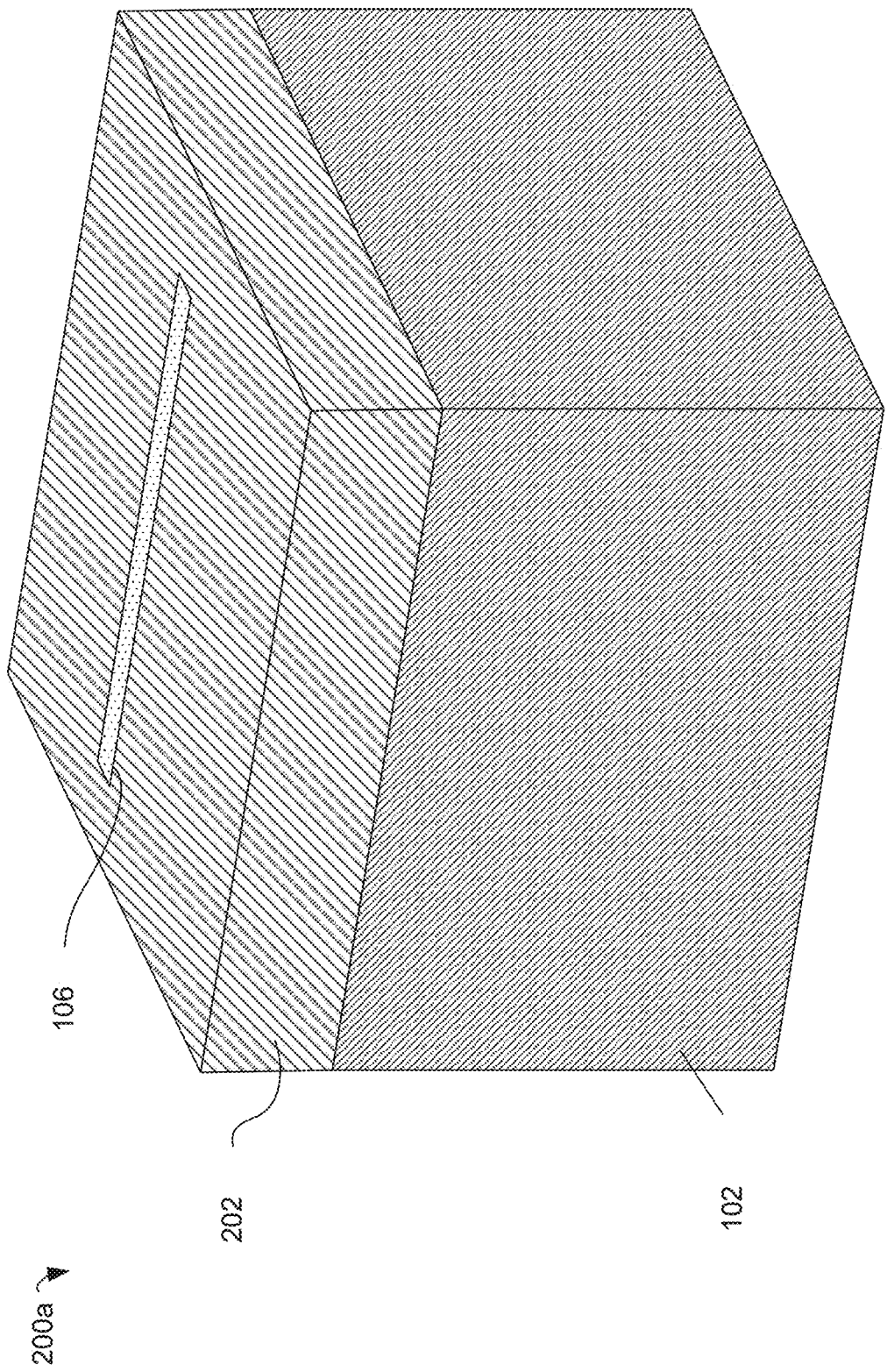

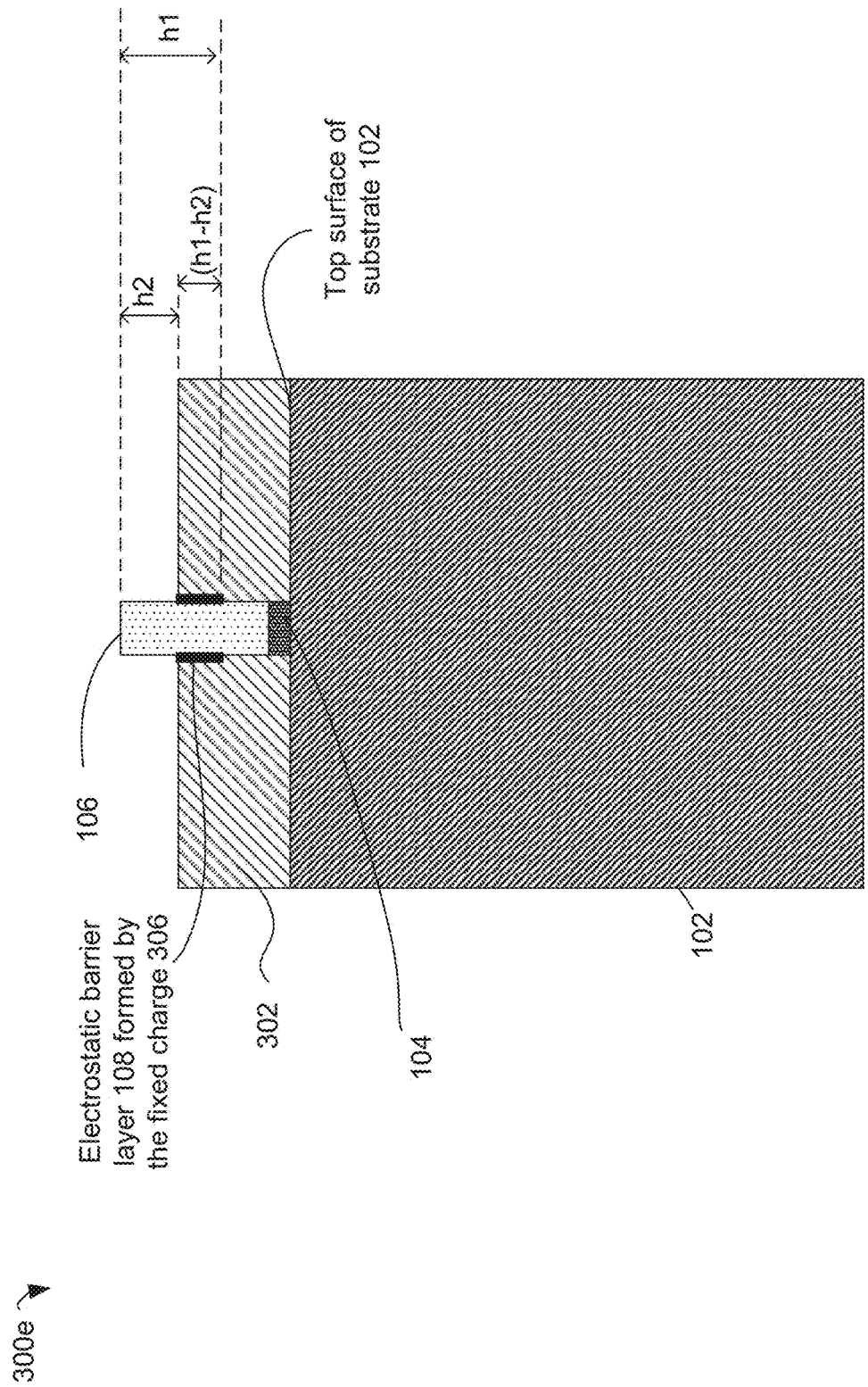
Fig. 3E1

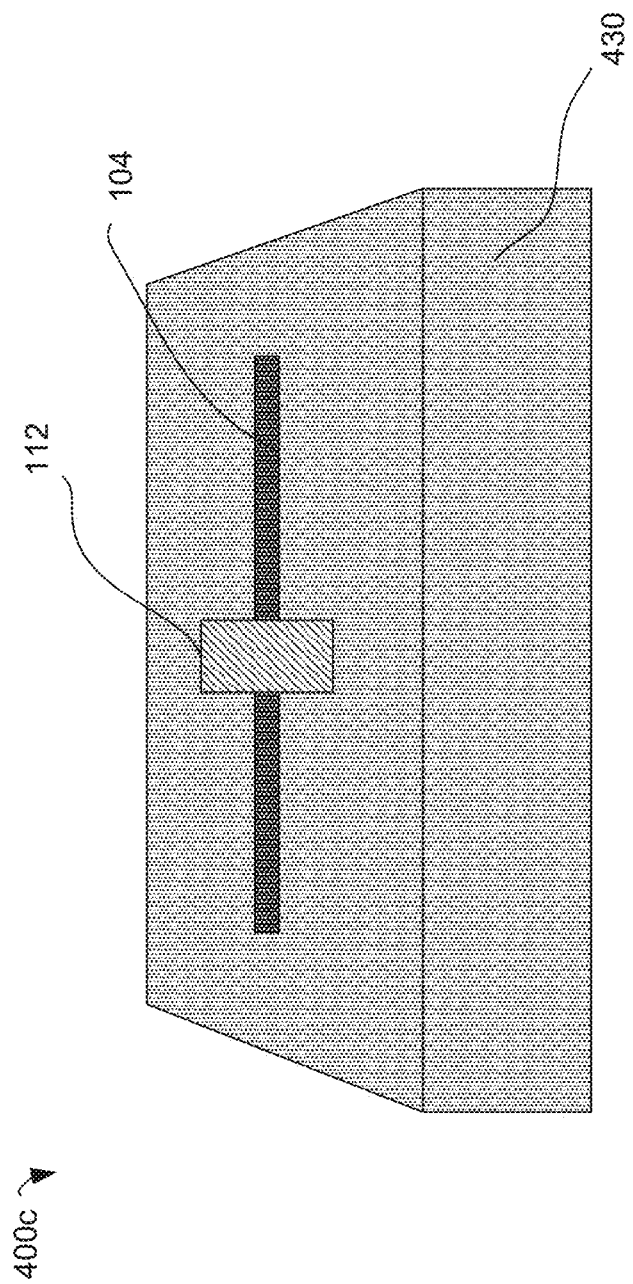

under the fin. A bottom section of the
VERTICALLY STACKED TRANSISTORS IN A PIN

CLAIM OF PRIORITY

This Application is a National Stage Entry of, and claims priority to, PCT Application No. PCT/US2017/025004, filed on Mar. 30, 2017, and titled "VERTICALLY STACKED TRANSISTORS IN A FIN," which is incorporated by reference in its entirety for all purposes.

BACKGROUND

A fin in a semiconductor device may be used, for example, to form a transistor. For example, the transistor may be formed using a top section of a fin. A bottom section of the fin is generally not used for forming any transistor, for example.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 2A-2C illustrate operations associated with forming a barrier layer using ion implant, according to some embodiments.

FIGS. 3A-3E1 illustrate operations associated with forming a barrier layer in a fin by depositing fixed charge on the fin, according to some embodiments.

FIGS. 4A-4D illustrate formation of a gate stack via a backside reveal process, according to some embodiments.

DETAILED DESCRIPTION

Figure 1A:
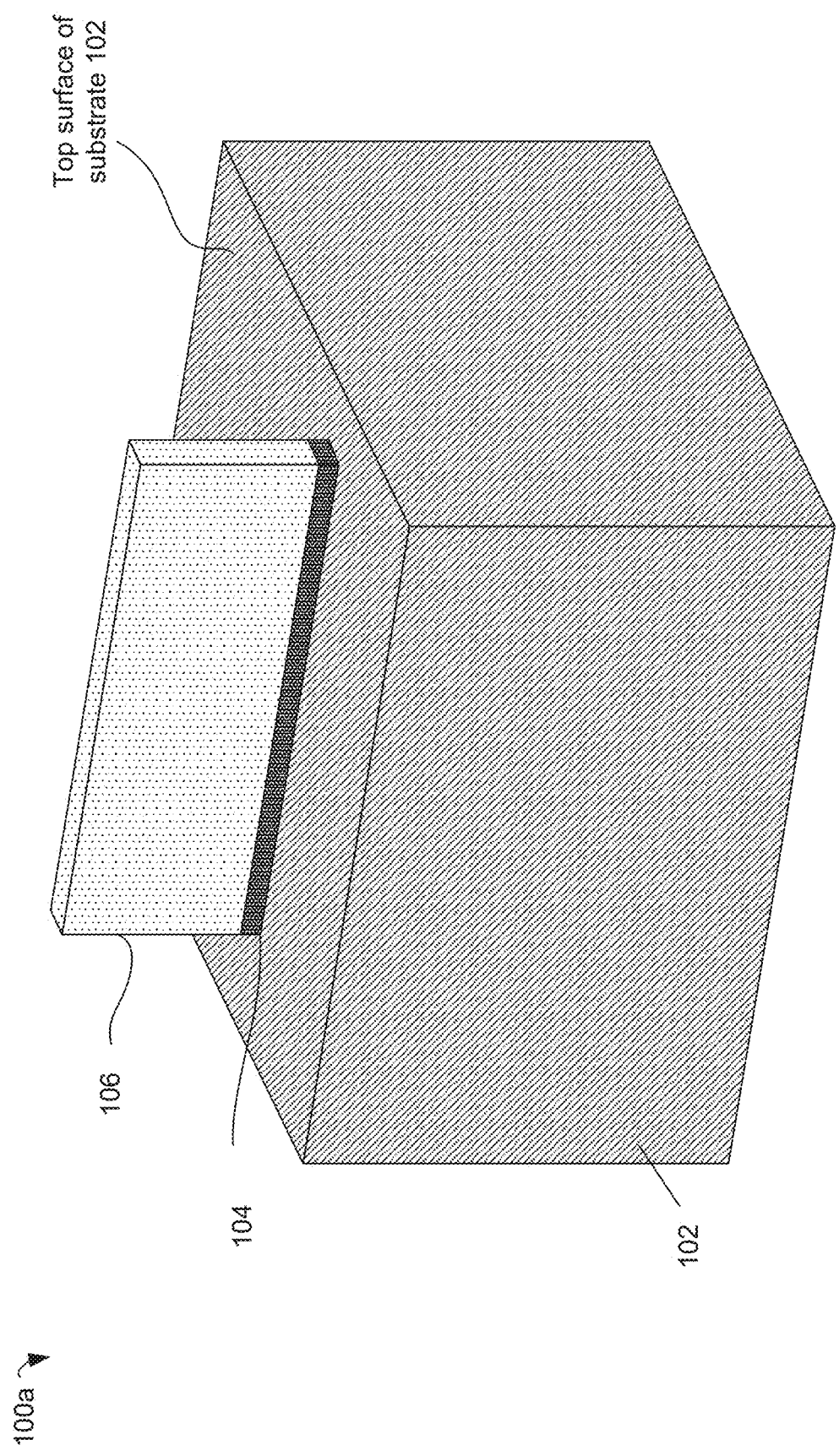
FIGS. 1A-1G illustrate various operations associated with forming a device having a fin with an electrostatic barrier layer, where a first transistor is formed above the electrostatic barrier layer on the fin and a second transistor is formed below the electrostatic barrier layer on the fin, according to some embodiments.

In some embodiments, a semiconductor component having a fin may be formed. An electrostatic barrier layer may be formed on the fin, where the electrostatic barrier layer divides the fin in a top section and a bottom section. In some embodiments, the electrostatic barrier layer may act as an electrical isolation layer between the top and bottom sections of the fin. In some embodiments, the electrostatic barrier layer may be formed by ion implantation on a central region of the fin. In some embodiments, the electrostatic barrier layer may be formed by deposition of fixed charges contained within a dielectric layer on the central region of the fin.

In some embodiments, a gate stack may be formed on the fin. The gate stack may have a top section that is formed on the top section of the fin, and a bottom section that is formed on the bottom section of the fin. The top and bottom sections of the gate stack may be separated by an insulating layer. In some embodiments, the gate stack (e.g., the bottom section of the gate stack) may be formed by front side processing of the component. In some other embodiments, the gate stack (e.g., the bottom section of the gate stack) may be formed by a back-side reveal process of the component.

In some embodiments, a first transistor may be formed on the top section of the fin and a second transistor may be formed on the bottom section of the fin. The top section of the gate stack may form a gate region for the first transistor, and the bottom section of the gate stack may form a gate region for the second transistor. In some embodiments, more than one transistor may be formed on the top section of the fin, and more than one transistor may be formed on the bottom section of the fin.

In some embodiments, the electrostatic barrier layer may be patterned to form an opening. The fin in the region of the opening may also be appropriately doped. The opening in the electrostatic barrier layer and/or the doping in the region of the opening may electrically connect the first transistor and the second transistor.

There are many technical advantages of various embodiments. For example, conventional system allows formation of a transistor using only top-most portion of a fin. However, in various embodiments discussed herein, a vertical isolation in the fin (e.g., provided by the electrostatic barrier layer) allows introduction of devices both atop and below the vertical isolation on the same fin. This allows forming stacked devices on the same fin. In some embodiments, the stacked devices may also be interconnected, e.g., by patterning the electrostatic barrier layer to create an opening and/or by appropriately doping the fin in the region of the opening. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIGS. 1A-1G illustrate various operations associated with forming a device having a fin with an electrostatic barrier layer, where a first transistor is formed above the electrostatic barrier layer on the fin and a second transistor is formed below the electrostatic barrier layer on the fin, according to some embodiments. Referring to FIG. 1A, illustrated is a component 100a comprising a fin 106 formed on a wafer or a substrate 102. In some embodiments, a sacrificial layer 104 may be deposited in between the substrate 102 and the fin 106 (e.g., the fin 106 may be formed on the sacrificial layer 104).

The fin 106, for example, may comprise appropriate semiconductor material, such as silicon, in an appropriate form, and/or a compound comprising silicon or another semiconductor including, but not limited to, germanium, silicon-germanium (SiGe), gallium arsenide (GaAs), indium gallium arsenide (InGaAs), an appropriate III-V compound semiconductor, germanium-tin, lead telluride (PbTe), an appropriate II-VI semiconductor, amorphous semiconductor materials such as indium gallium zinc oxide (IGZO), and/or the like. In some embodiments, the sacrificial layer 104 may comprise, for example, a gap fill material, an insulating material, a dielectric material, and/or the like. In some embodiments, the sacrificial layer 104 may comprise an epitaxial layer, and may comprise germanium, silicon germanium (SiGe), and/or the like. The fin 106 and the sacrificial layer 104 may be formed on the substrate 102 using any appropriate operations to form such fins and sacrificial layers on a substrate.

FIG. 1A illustrates the fin 106 to be approximately rectangular in cross section. However, the principles of this disclosure may be applied to any other shape of the fin 106, e.g., to fins having trapezoidal cross section, hourglass cross section, triangular cross section, etc., or to a nanoribbon, a nanowire fin, and/or the like.

Figure 1B:
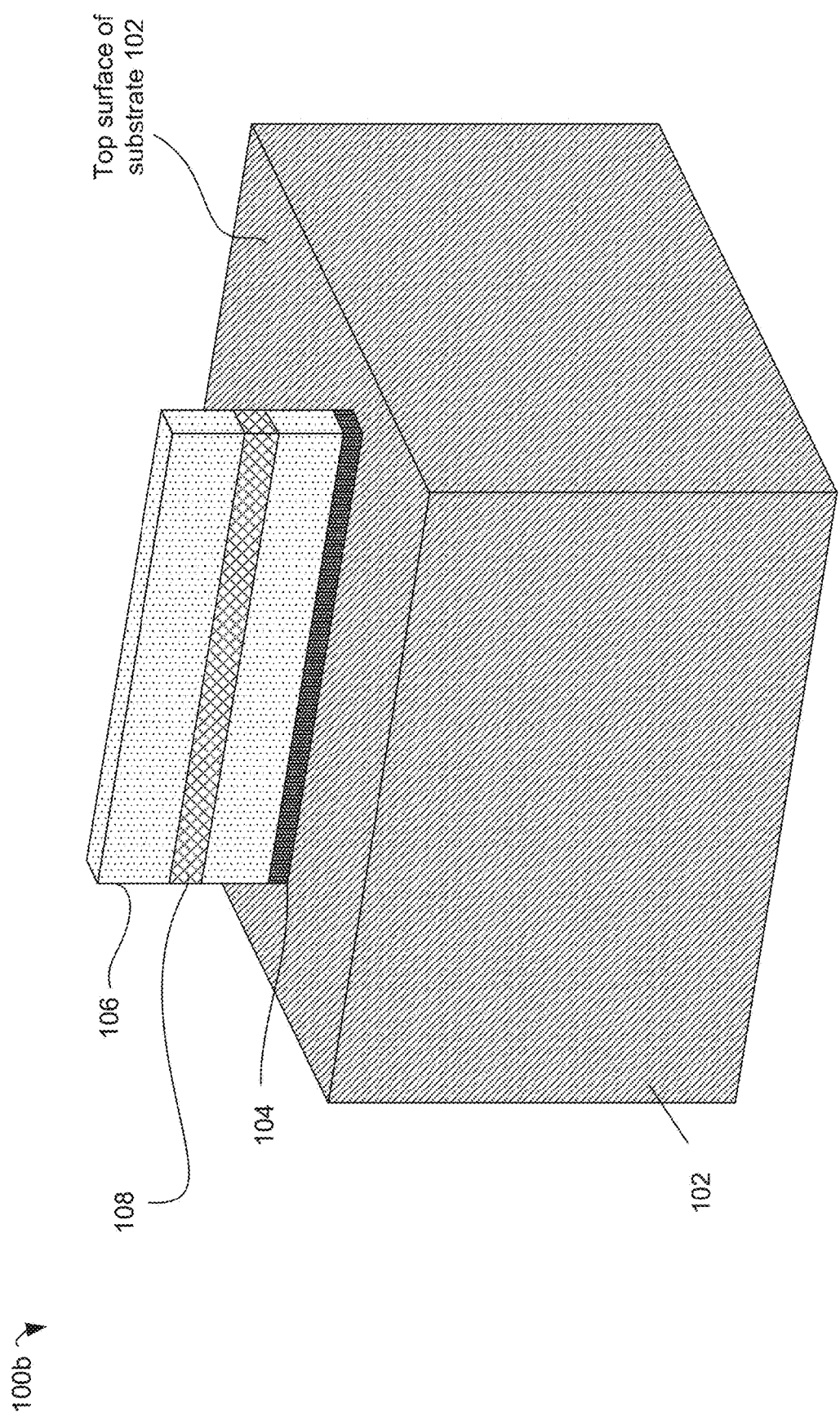

FIG. 1B illustrates formation of an electrostatic barrier layer 108 (henceforth also referred to as a "barrier layer 108," or simply as a layer "108") on a section (e.g., a central region vertically within the fin) of the fin 106, thereby forming a component 100b. For example, the barrier layer 108 divides or isolates the fin 106 into a top section and a bottom section. Accordingly, the barrier layer 108 may also be referred to as an isolation layer.

Figure 2B:
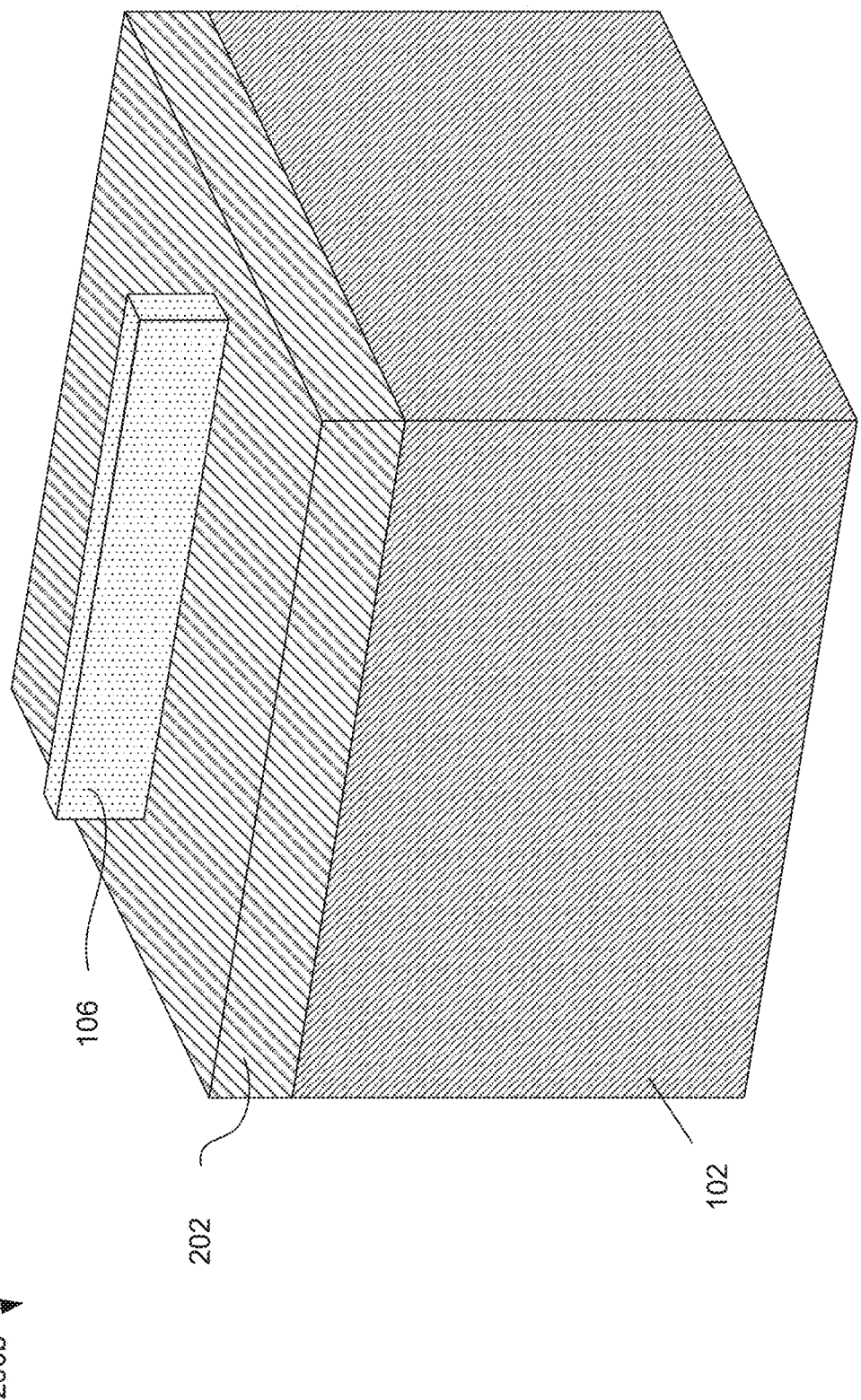
Figure 2C:
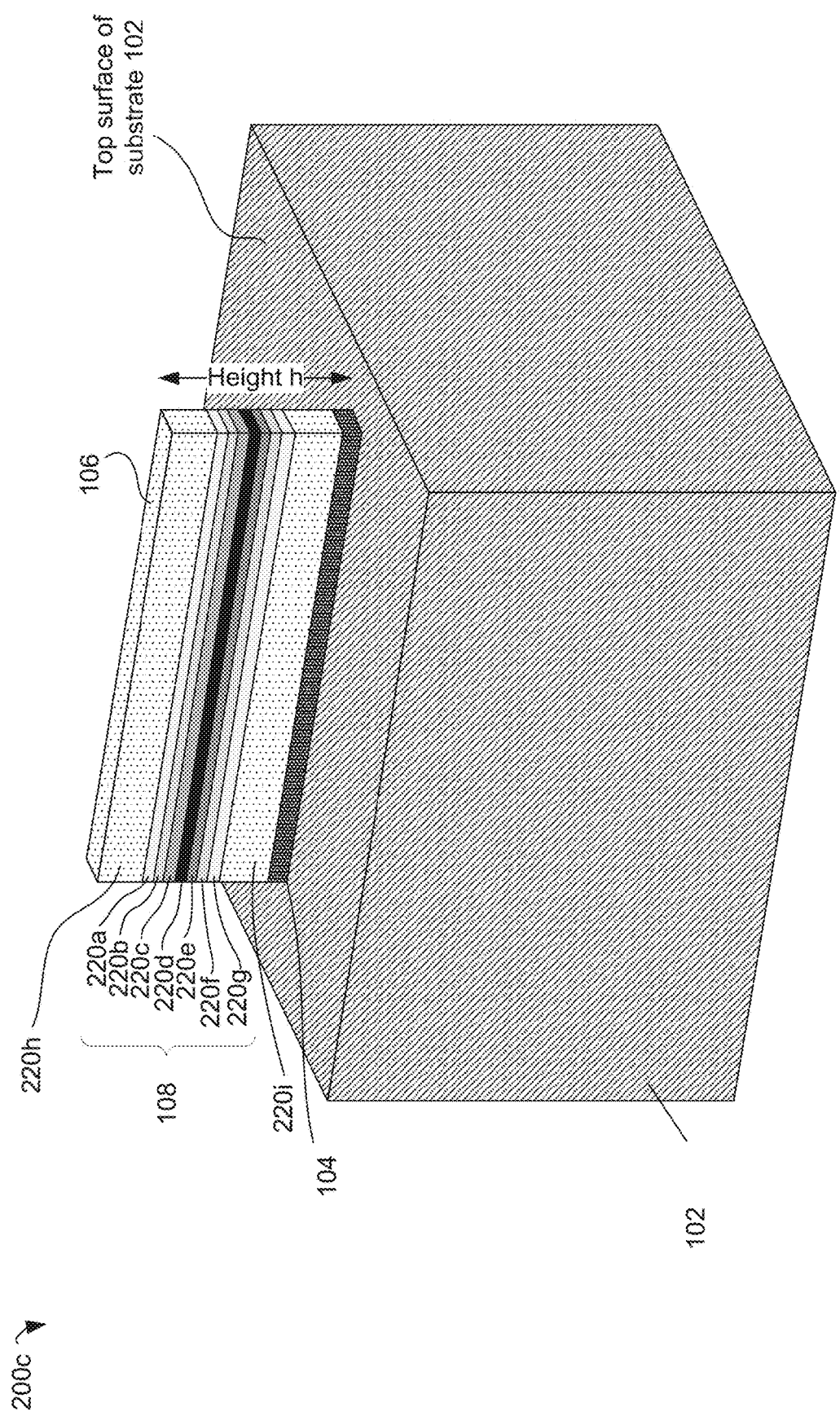

In some embodiments, the barrier layer 108 may be formed by one of many possible methods, and the properties of the barrier layer 108 may be based at least in part on the method applied to form the barrier layer 108. FIGS. 2A-2C illustrate operations associated with at least two methods to form the barrier layer 108 in the fin 106 using ion implantation, according to some embodiments.

Referring to FIG. 2A, in some embodiments, a component 200a may be formed by forming gap fill material 202 on a top surface of the substrate 102 of the component 100a of FIG. 1A (e.g., where the top surface of the substrate 102 is a surface of the substrate 102 on which the fin 106 is formed). In some embodiments, the gap fill material 202 may be an appropriate insulating or dielectric material. For example, the gap fill material 202 may be formed of materials which may include, but not be limited to, silicon dioxide, silicon oxynitride, spin on silicon oxide, or similar materials. In some embodiments, the gap fill material 202 may at least in part encapsulate the fin 106, and a top surface of the gap fill material 202 may be flush with a top surface of the fin 106. For example, the top surface of the fin 106 may be visible through the top surface of the gap fill material 202, as illustrated in FIG. 2A.

Referring to FIG. 2B, in some embodiments, a component 200b may be formed by partially recessing the gap fill material 202 from the component 200a of FIG. 2A. The recessing may be done, for example, by a polishing operation (e.g., by a chemical mechanical polishing operation), an etch operation, and/or the like. As a result of partially recessing the gap fill material 202, a top section of the fin 106 may be visible through the gap fill material 202. In some embodiments, if a height of the fin 106 is about h, a height of the exposed portion of the fin 106 (e.g., exposed through the recessed gap fill material 202) may be about h/2.

In some embodiments, an ion implant process may be performed on either the component 200a of FIG. 2A or the component 200b of FIG. 2B, for example, to form the barrier layer 108 illustrated in FIG. 2C. For example, if the ion implant process is performed on the component 200a of FIG. 2A, then the component 200b of FIG. 2B need not be formed. Thus, in some embodiments, the component 200b of FIG. 2B may be optional.

In some embodiments, the ion implant process may be performed through the gap fill material 202 (e.g., either through the un-recessed gap fill material 202 of FIG. 2A, or through the partially recessed gap fill material 202 of FIG. 2B). In some embodiments, the ion implant may be targeted to provide doping within a central region of the fin 106. For example, if the height of the fin 106 is about h (e.g., as illustrated in FIG. 2C), a center region of the fin 106 may be at a height of about h/2. In some embodiments, the central region of the fin 106 may have a highest concentration of doping, and regions at the top and bottom of the fin 106 may have relatively low doping, or no doping at all.

In some embodiments, the ion implant to generate the doping profile in FIG. 2C may be performed such that the ions are directed towards a central region. The ion implant may be through the gap fill material 202. In some embodiments, the ion implant may be performed with two, four or more ion beam orientations such as to efficiently dope all sides of the fin 106. The ion implantation may be followed by a thermal anneal so as to electrically activate the doping. In yet another example, a plasma implantation operation may be used to dope the fin 106, which may also be followed by a thermal anneal operation to electrically activate the doping.

In an example, FIG. 2C illustrates an example doping profile in the fin 106 that is formed by ion implant in the components 200a or 200b of FIG. 2A or 2B. In some embodiments, the doping in a central region 220d may be maximum. Doping in a region 220c (e.g., which is above the central region 220d) may be lower than the doping in the central region 220d; doping in a region 220b (e.g., which is above the region 220c) may be lower than the doping in the region 220c; doping in a region 220a (e.g., which is above the region 220b) may be lower than the doping in the region 220b. Similarly, doping in a region 220e (e.g., which is below the central region 220d) may be lower than the doping in the central region 220d; doping in a region 220f (e.g., which is below the region 220e) may be lower than the doping in the region 220e; doping in a region 220g (e.g., which is below the region 220f) may be lower than the doping in the region 220f, and so on. The regions 220h (e.g., at a top section of the fin 106) and 220i (e.g., at a bottom section of the fin 106) may have minimum, negligible, or no doping (e.g., the regions 220h and 220i may be substantially un-doped). The regions 220a, . . . , 220g may form the barrier layer 108 of FIG. 1B.

Although FIG. 2C illustrates the fin 106 not being covered by the gap fill material 202, the gap fill material 202 may be present in the component 200c (and may fully or partially cover the fin 106, e.g., based on whether the ion implant is performed on the component 200a or 200b). The gap fill material 202 is not illustrated in FIG. 2C for purposes of illustrative clarity.

Although FIG. 2C illustrates discrete and separate regions having different doping concentration for illustration purposes, the doping profile may be continuous or gradual, e.g., with highest doping concentration in the central region of the fin 106 and the doping gradually decreasing towards the top and bottom sections of the fin 106. In some embodiments, the ion implant generates a barrier or an isolation region on all sides around the central region of the fin 106. The barrier layer 108 generated using the ion implant process is discussed further with respect to FIG. 1C herein.

In some embodiments, a doping profile generated by ion implant on the component 200a of FIG. 2A may be different from a doping profile generated by ion implant on the component 200b of FIG. 2B, for example, because the top section of the fin 106 in FIG. 2B is not covered with the gap fill material 202. Merely as an example, the doping profile generated by ion implant on the component 200a of FIG. 2A may be somewhat symmetrical around the central region 220d (e.g., regions 220c and 220e may have somewhat similar doping concentration). However, the doping profile generated by ion implant on the component 200b of FIG. 2B may not be symmetrical around the central region 220d (e.g., region 220c may have slightly different doping concentration than the region 220e).

Figure 3A:
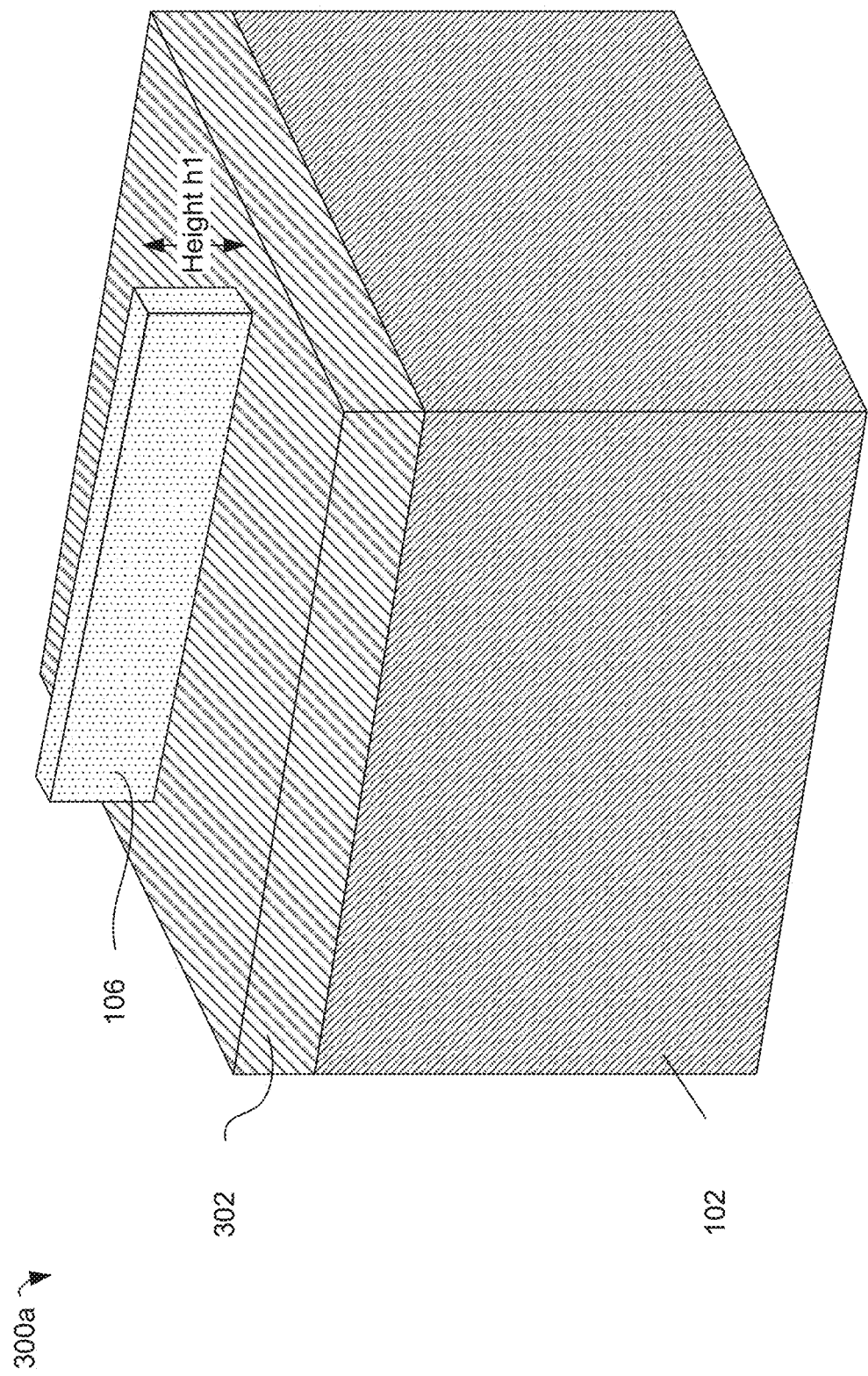

FIGS. 2A-2C illustrate two example methods of forming the barrier layer 108 using ion implant (e.g., a first method comprising the operations discussed in FIGS. 2A and 2C, and a second method comprising the operations discussed in FIGS. 2A, 2B, and 2C). FIGS. 3A-3E1 illustrate operations associated with a third method to form the barrier layer 108 in the fin 106 by depositing dielectric layers containing fixed charge on the fin 106, according to some embodiments.

Referring to FIG. 3A, illustrated is a component 300a in which a recessed gap fill material 302 may at least partially cover the fin 106. The component 300a may be formed at least in part similar to the formation of the component 200b of FIG. 2B, and hence, the formation of the component 300a and the gap fill material 302 are not discussed in further detail herein. Assume that the exposed section of the fin 106 in FIG. 3A has a height of about h1.

Figure 3B:
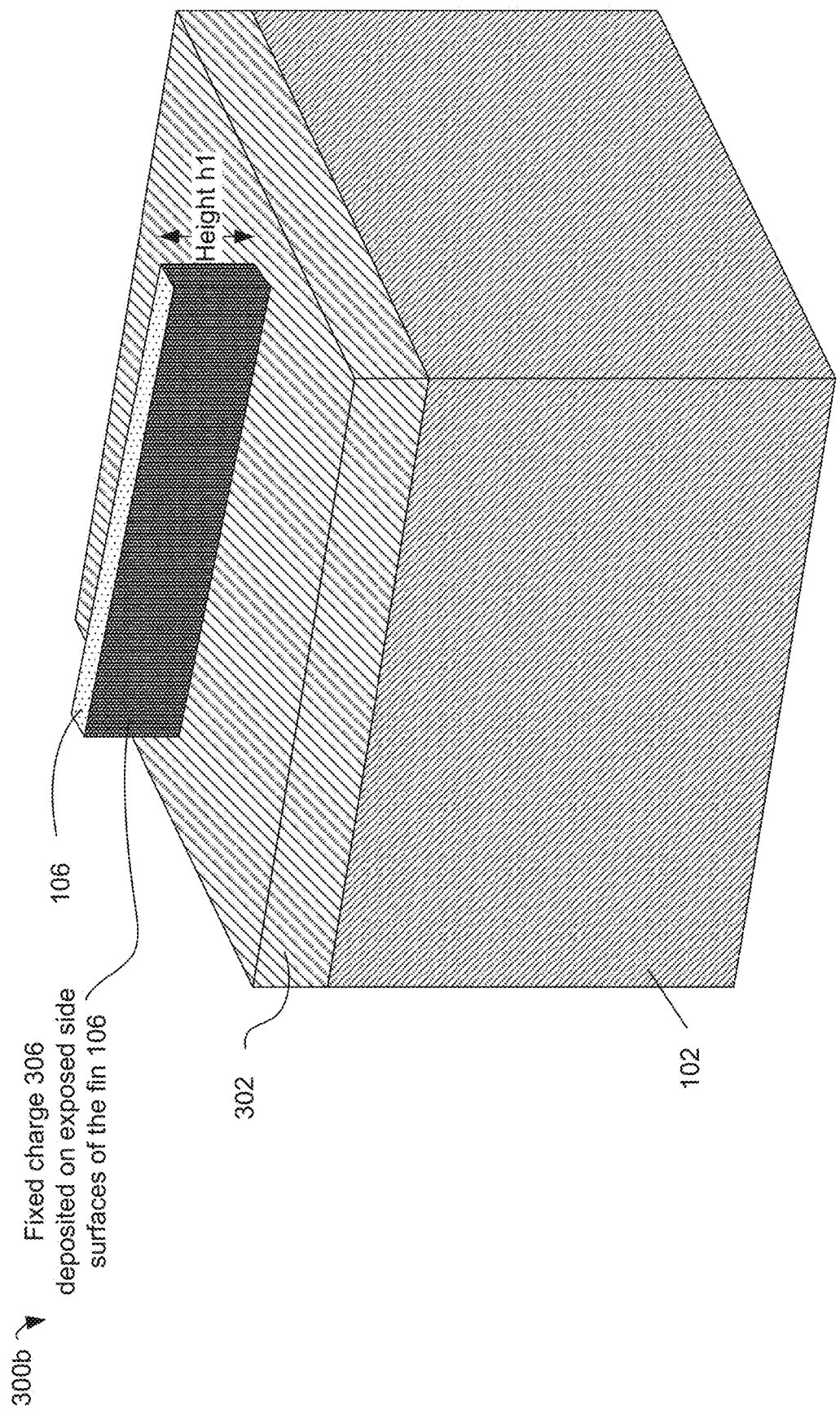

Referring to FIG. 3B, fixed charge 306 may be deposited on the exposed side surfaces of the fin 106 to form a component 300b. In general, a fixed charge material is a dielectric material that contains fixed charges (i.e. charges which are not mobile), which could be either positive or negative charges depending on a bandgap of a dielectric material and on how the dielectric material was formed/processed, with the concentration of the fixed charges in the fixed charge material being higher than that accounting for whichever unintentional fixed charges may be present in a typical dielectric of the same type of material. For example, the concentration of the fixed charges in the fixed charge dielectric material 132 may be 1012, or higher, per square centimeter.

Conventionally, having fixed charges in or around transistors has been something to avoid and to reduce (unintentional small amounts of fixed charges are often inevitable), by careful architecture design, choice of materials, and tight control of fabrication processes. In contrast to this conventional line of thinking, inventors of the present disclosure realized that deliberately adding fixed charge, to carefully and specifically selected locations of a transistor arrangement, may actually provide advantages. This realization is based on recognition that if a dielectric material having a sufficient amount of fixed charges is provided in the fin 106 where it is desirable to prevent flow of any currents, then the fixed charges of the fixed charge dielectric material can interact with the mobile charges by Coulomb forces and can deplete or block mobile charges in that part of the fin 106, which could be used to isolate sections of the fin 106, thereby acting as a barrier layer within the fin 106.

Either positive or negative charge may be deposited (e.g., as discussed herein with respect to FIG. 1B later) as fixed charge within a dielectric layer. In some embodiments, the dielectric layer includes one of: Al, O, Si, or N, or a combination of them. In some embodiments, the dielectric layer includes one of: Aluminum oxide (Al2O3) or Silicon Nitride (Si3N4). In some embodiments, Al2O3, Si3N4, and/or other appropriate material may be used to deposit the fixed charge 306. For example, these layers may be engineered to be deposited with high concentrations of impurities (e.g., Hydrogen), which may be thermally annealed out after deposition.

Figure 3C:
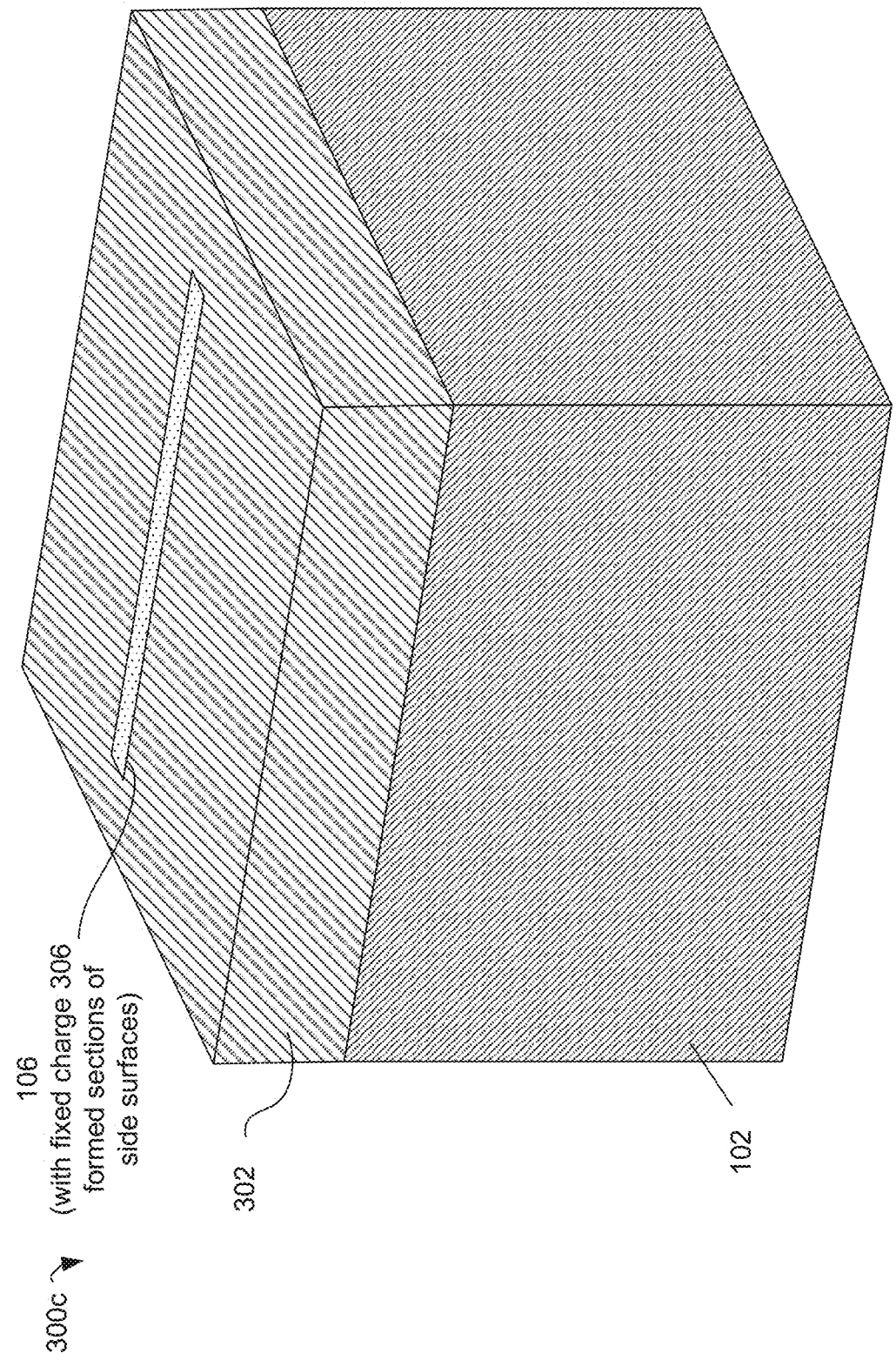

Referring now to FIG. 3C, additional gap fill material 302 may be deposited and planarized to encapsulate the fin 106 and form a component 300c. In some embodiments, a top surface of the fin 106 may be visible through a top surface of the gap fill material 302.

Figure 3D:
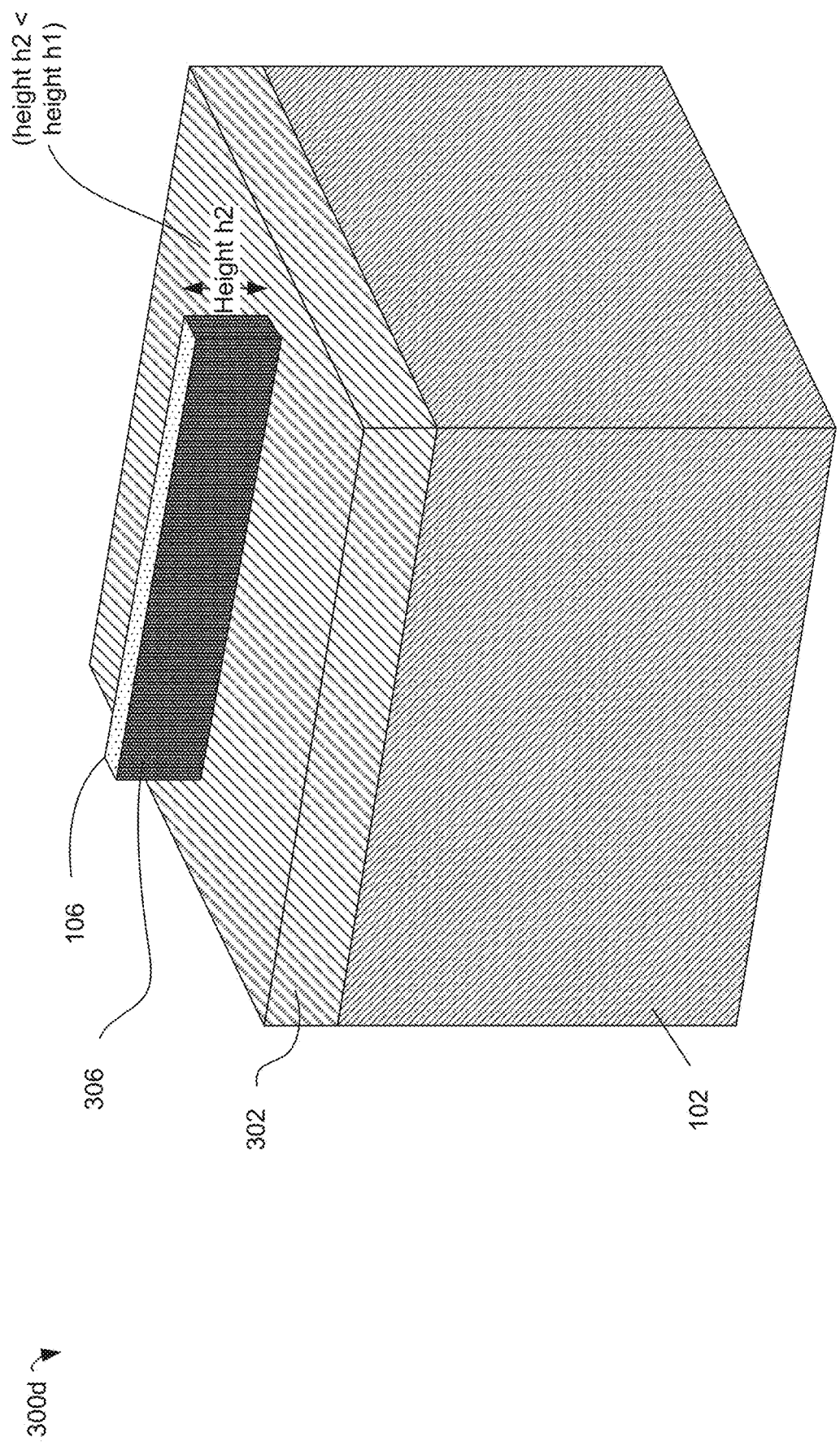
Figure 3E:
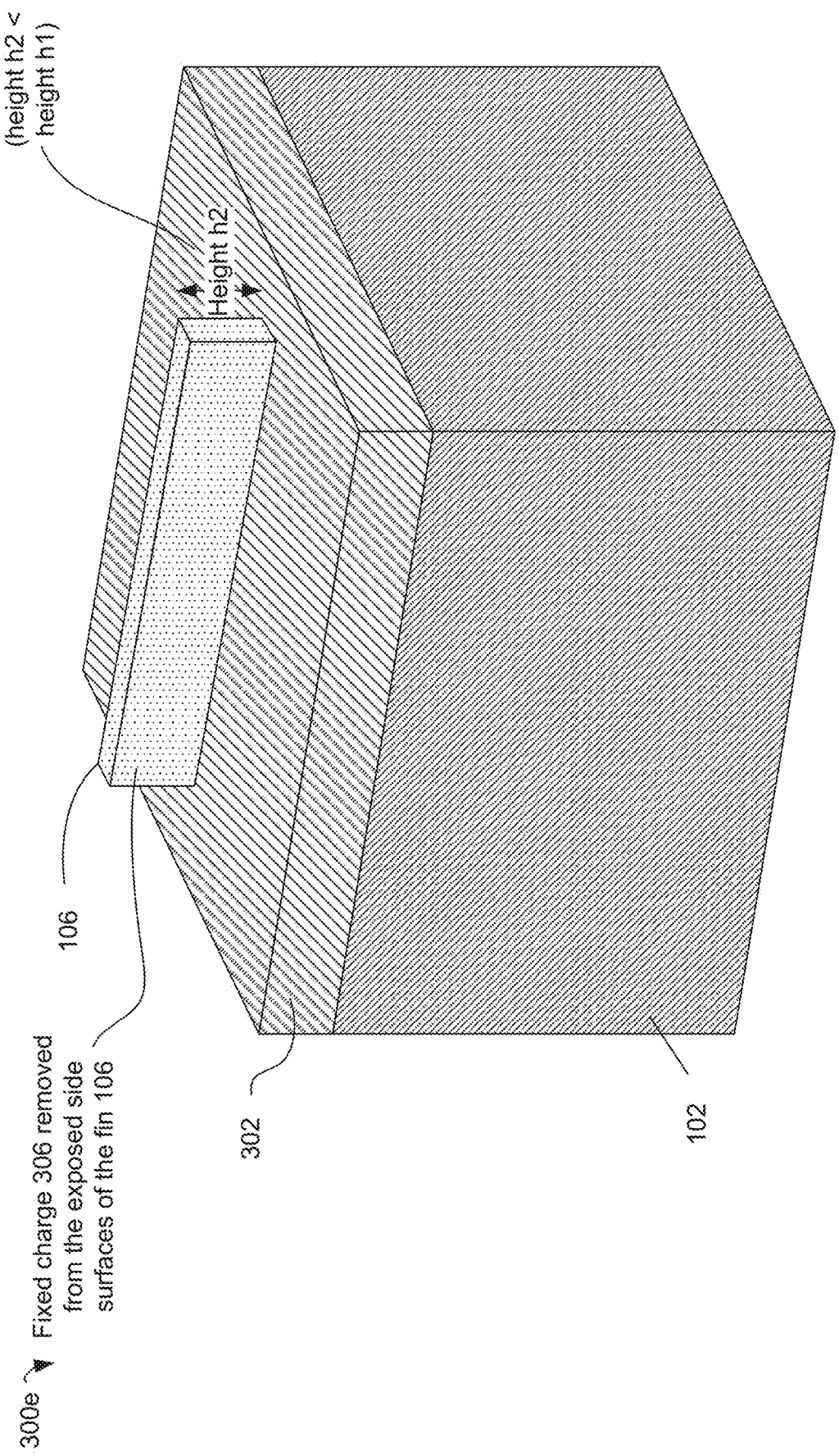

Referring to FIG. 3D, illustrated is a component 300d in which the gap fill material 302 of the component 300c may be partially recessed to partially expose the fin 106. For example, the exposed section of the fin 106 in the component 300d may have a height of h2, where the height h2 may be less than the height h1 of the components 300a and 300b.

Referring to FIG. 3E, illustrated is a component 300e formed by removing the fixed charge 306 from the partially exposed surfaces of the fin 106. For example, the exposed section of the fin 106 in the component 300e may have the height of h2, and the fixed charge 306 may be removed from the exposed section with the height of h2. It is to be noted that because the height h2 is less than the height h1, the fixed charge 306 may not be removed from sections of the fin 106 that are still covered by the gap fill material 302. In some embodiments, the fixed charge 306 may be removed from the exposed section of the fin 106 by wet etch or another appropriate technique.

FIG. 3E1 illustrates a cross sectional view of the component 300e of FIG. 3E, when viewed from a side of the component 300e. As illustrated in FIG. 3E1, fixed charge 306 remains on at least a section of the fin 106, e.g., around a central region of the fin 106. For example, the height of the fixed charge (e.g., which may be contained within the dielectric layer) may be a difference between the heights h1 and h2. In some embodiments, the fixed charge contained within the dielectric layer 306 may wrap around or fully encircle the fin 106, and divide the fin 106 is a top region and a bottom region. In some embodiments, the remaining fixed charge 306 on the fin in FIGS. 3E and 3E1 may be the barrier layer 108 of FIG. 1B.

Referring again to FIG. 1B, as discussed herein above, the barrier layer 108 can be formed through ion implantation (e.g., as discussed with respect to FIGS. 2A-2C) or through application of fixed charge 306 (e.g., as discussed with respect to FIGS. 3A-3E1). In some embodiments, the barrier layer 108 may provide a vertical isolation within the fin 106. For example, the barrier layer 108 divides the fin 106 in approximately two equal sections. As discussed herein above, if the barrier layer 108 is generated using ion implantation, for example, there may not be any sharp or distinct boundary for the barrier layer 108, and the doping concentration may gradually decrease from a central region of the fin 106 to the top and bottom portions of the fin 106 (e.g., as discussed with respect to FIG. 2C).

In some embodiments, a sign of the implanted ion or the fixed charge in the barrier layer 108 for isolation may depend upon the polarity of a device to be formed. For example, for a N type device (e.g., an NMOS), negative charge may be deposited in the barrier layer 108 for isolation, and for a P type device (e.g., a PMOS), positive charge may be deposited in the barrier layer 108 for isolation. In some embodiments, a magnitude of the fixed charge 306 may depend upon the device doping, and may be in the order of about 1e12/square centimeter to about 1e13/square centimeter. In some embodiments, a magnitude of implanted dopant atoms in the barrier layer 108 for isolation may be in the order of about 5e17/cubic centimeter to about 5e19/cubic centimeter.

FIGS. 2A-2C illustrate two example methods of forming the barrier layer 108 using ion implant, and FIGS. 3A-3E1 illustrate operations associated with a third method to form the barrier layer 108 in the fin 106 by depositing dielectric layers containing fixed charge. In some embodiments, the barrier layer 108 may be formed by one or more other appropriate manners as well. For example, although not illustrated in the figures, a fourth method of forming the barrier layer 108 may utilize a deposited layer or film containing doping. The deposited layer containing the doping may be placed about the central region vertically within the fin 106 (e.g., where the barrier layer 108 is to be formed), followed by a thermal anneal to diffuse the doping from the deposited layer into the adjacent area of the fin 106. Examples of materials which could be used to provide doping for this fourth method may include Boron (B), Phosphorous (P), Silicon (Si), a compound thereof, boron-silicate glass (BSG), phosphorus silicate glass (PSG), other doped silicate glasses, and/or other materials containing doping species.

Figure 1C:
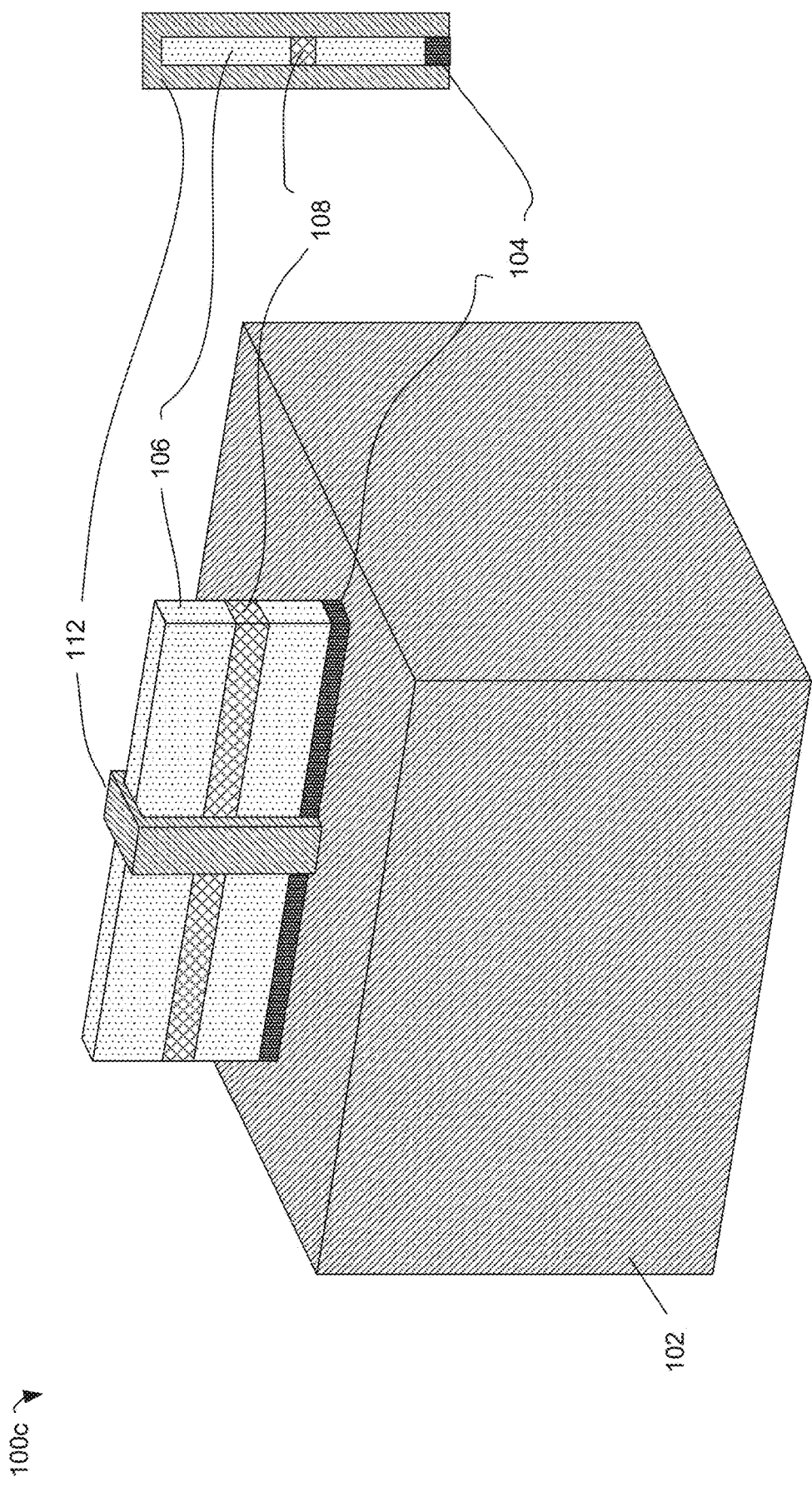
Figure 1D:
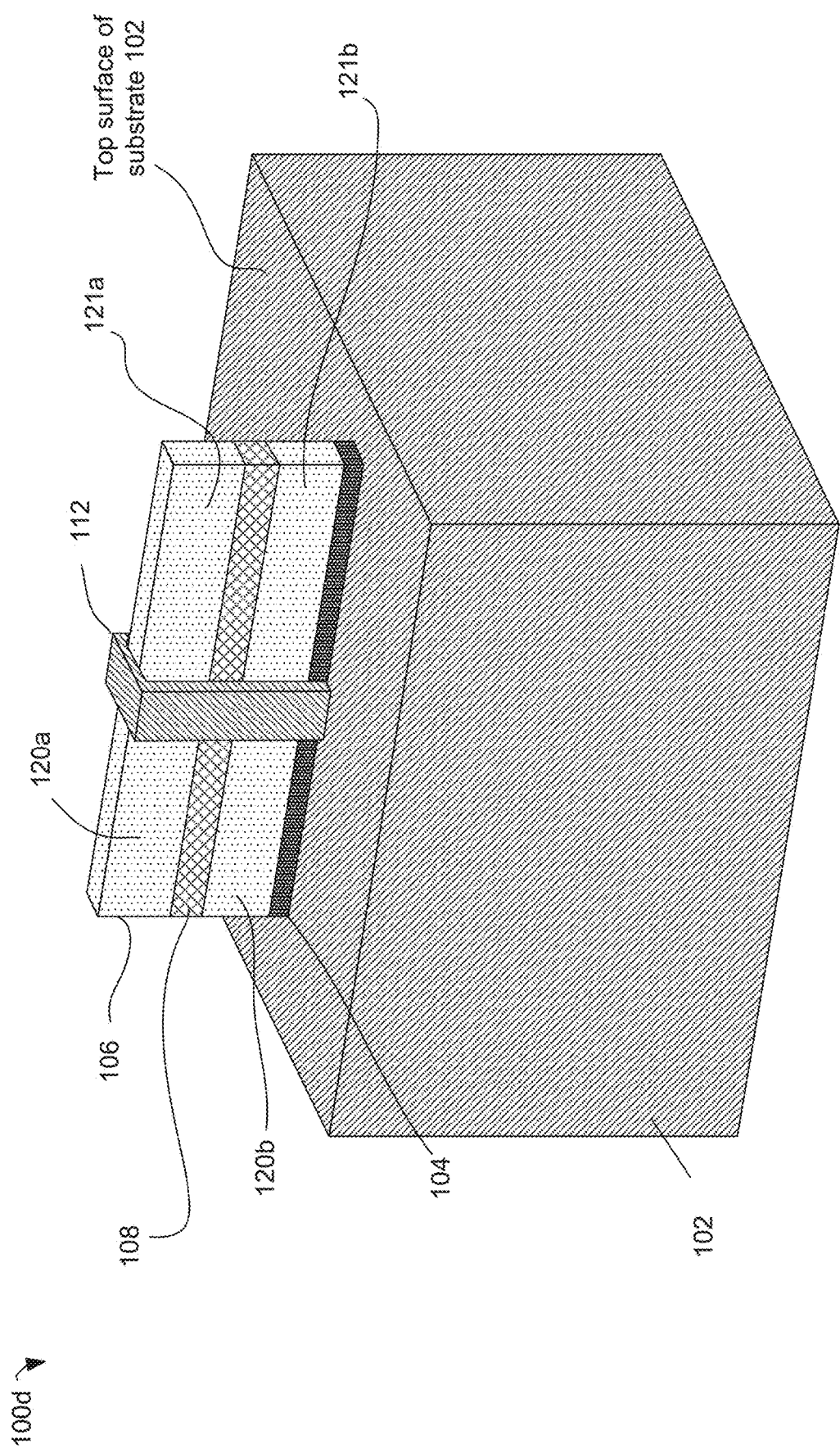

Referring now to FIG. 1C, in some embodiments, a sacrificial gate layer 112 may be formed on the component 100b to form a component 100c. A left section of FIG. 1C illustrates a perspective view of the component 100c, while a right section of FIG. 1C illustrates a cross-sectional view of the component 100c (although the cross-sectional view does not illustrate the substrate 102 for purposes of illustrative clarity).

In some embodiments, the sacrificial gate layer 112 may encircle or wrap around the fin 106 on the top and two sides. For example, the sacrificial gate layer 112 may not completely encircle the fin 106, as the sacrificial gate layer 112 may not be deposited on a bottom surface of the fin 106. In some embodiments, the interior sides of the sacrificial gate layer 112 may be adjacent to, attached to, in contact with, and/or formed on the fin 106, e.g., as more clearly illustrated in the cross-sectional view of FIG. 1C.

In some embodiments, the sacrificial gate layer 112 may comprise, for example, a gap fill material, an insulating material, a dielectric material, and/or the like. In some embodiments, the sacrificial gate layer 112 may comprise an epitaxial layer, and may comprise Germanium, Silicon Germanium (SiGe), and/or the like.

Although not illustrated in the figures, subsequent to forming the sacrificial gate layer 112, various operations may be performed on the component 100c of FIG. 1C. Merely as an example, regions of the fin 106 may be selectively doped to form source regions and drain regions, etc. For example, example source regions 120a and 120b, and example drain regions 121a and 121b are illustrated to be formed on the fin 106 in a component 100d of FIG. 1D.

The source regions 120a/b and the drain regions 121a/b may be doped using any appropriate technique. For example, the doping can be introduced using Borosilicate glass (BSG) material, Phosphosilicate glass (PSG) deposed upon the exposed sections of the fin 106 via a technique such as chemical vapor deposition (CVD) or atomic layer deposition (ALD), followed by a thermal anneal to diffuse doping from the BSG/PSG film to the corresponding regions of the fin 106. In an example, an appropriate material with high amount of boron and/or phosphorous doping therein can be used for doping a silicon or germanium region. In another example, epitaxy techniques may be used for doping. For example, vapor phase epitaxy, followed by an anneal to diffuse the doping, may be used. In another example, ion implantation, followed by a thermal anneal, may be used to dope the regions of the fin 106. In yet another example, a plasma implantation operation, followed by a thermal anneal, may be used to dope the regions of the fin 106.

Figure 1E:
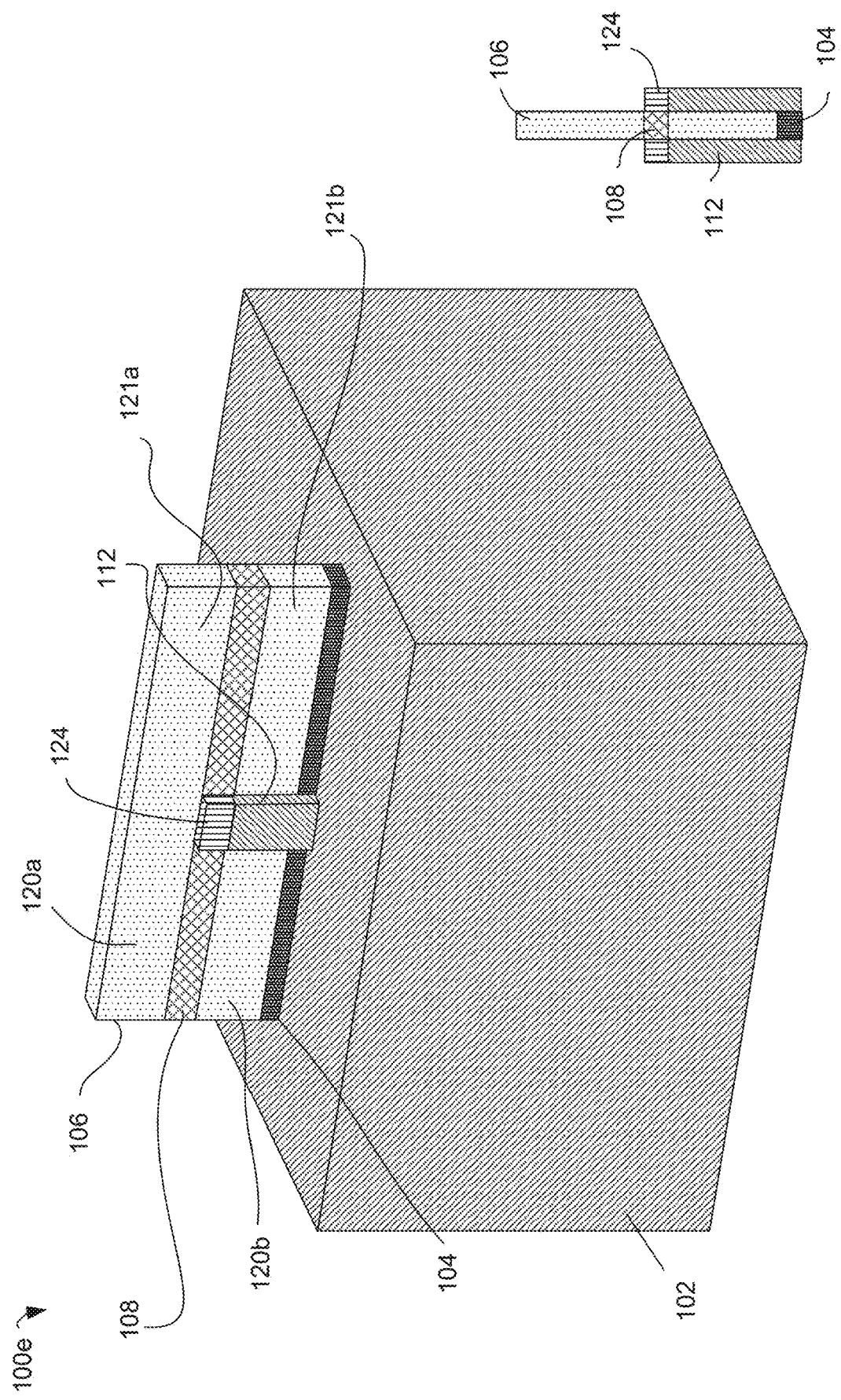

Referring now to FIG. 1E, in some embodiments, a top portion of the sacrificial gate layer 112 may be removed on the component 100d to form a component 100e. A left section of FIG. 1E illustrates a perspective view of the component 100e, while a right section of FIG. 1E illustrates a cross-sectional view of the component 100e (although the cross-sectional view does not illustrate the substrate 102 for purposes of illustrative clarity).

The top portion of the sacrificial gate layer 112 may be removed via, for example, a timed etch process or another etch process designed to stop at about a middle region of the sacrificial gate layer 112. Thus, a little more than a top half of the sacrificial gate layer 112 may be removed.

In some embodiments, subsequent to a removal of the top section of the sacrificial gate layer 112, an insulating layer 124 may be formed on top of the remaining portion of the sacrificial gate layer 112. The insulating layer 124 may be formed, for example, using any appropriate insulating material, such as silicon nitride, aluminum oxide, silicon carbide, silicon oxide, and/or other electrically insulating material.

Figure 1F:
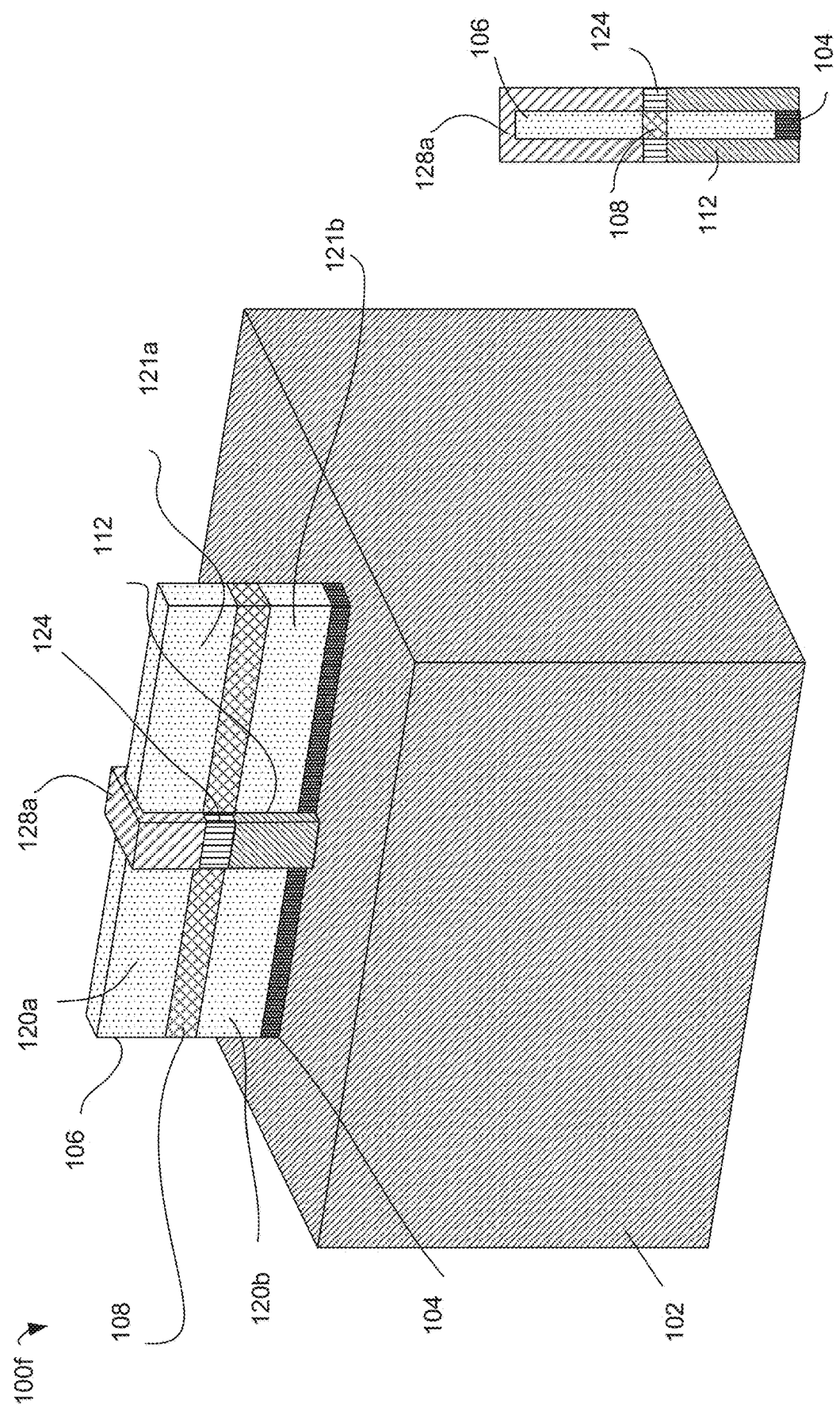

Referring now to FIG. 1F, in some embodiments, a top side gate 128a may be formed on the insulating layer 124, to form a component 100f. A left section of FIG. 1F illustrates a perspective view of the component 100f, while a right section of FIG. 1E illustrates a cross-sectional view of the component 100f (although the cross-sectional view does not illustrate the substrate 102 for purposes of illustrative clarity). In some embodiments, the top side gate 128a may be formed in a void formed by removal of the top portion of the sacrificial gate layer 112. The interior sides of the top side gate 128a may be adjacent to, attached to, or formed on the fin 106 (e.g., as more clearly illustrated in the cross-sectional view).

Figure 1G:
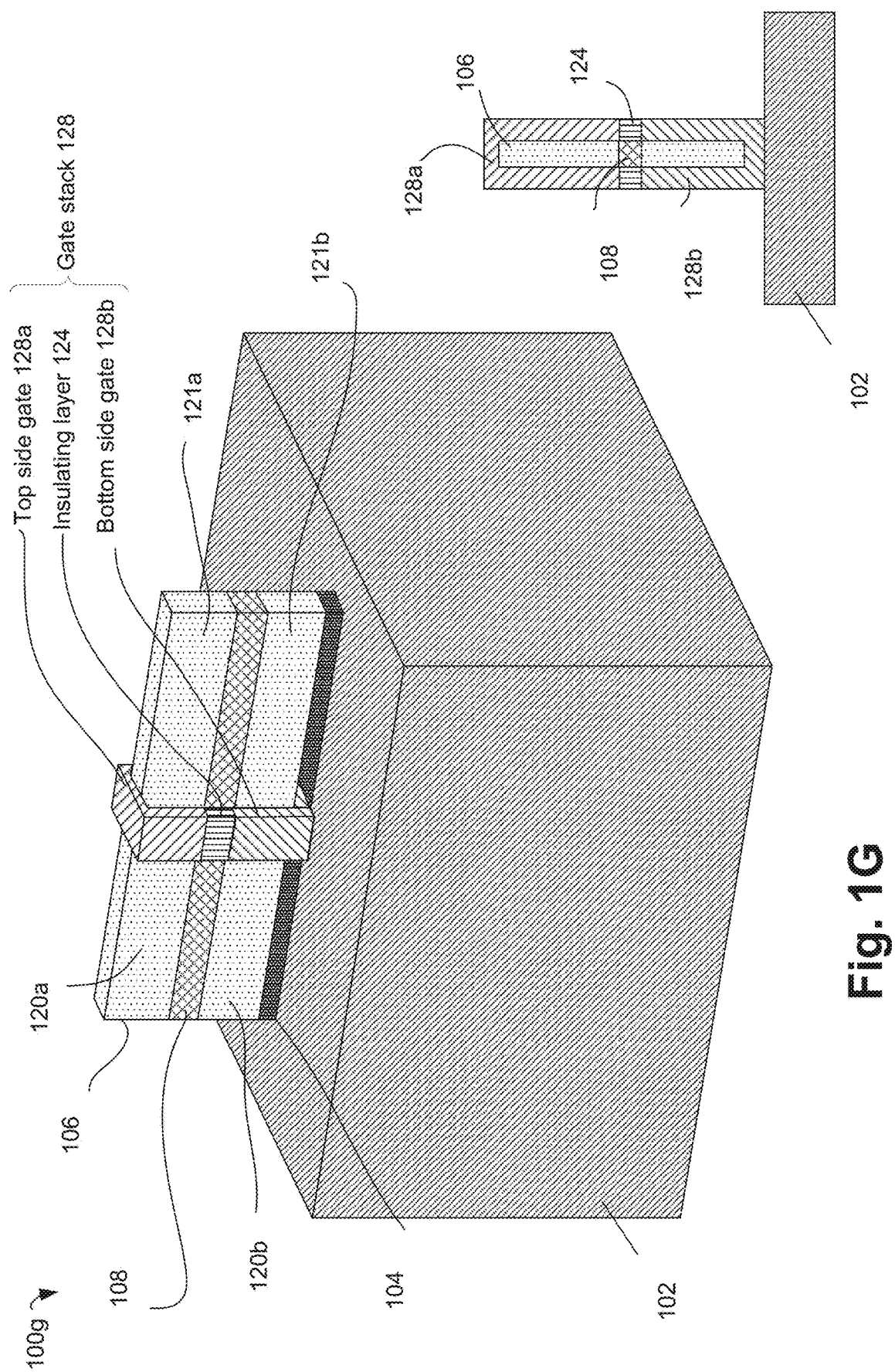

Referring now to FIG. 1G, in some embodiments, the remaining bottom portion of the sacrificial gate layer 112 may be replaced by a bottom side gate 128b, to form a component 100g. A left section of FIG. 1G illustrates a perspective view of the component 100g, while a right section of FIG. 1G illustrates a cross-sectional view of the component 100g. In some embodiments, while the sacrificial gate layer 112 was not underneath the fin 106 (e.g., as illustrated in the cross-sectional view of FIGS. 1C, 1E and 1F), the bottom side gate 128b may also be formed underneath the fin 106 (e.g., as illustrated in the cross-sectional view of FIG. 1G).

For example, initially the remaining bottom portion of the sacrificial gate layer 112 in the component 100f may be removed or etched to generate a void. Subsequently, sections of the sacrificial layer 104 (e.g., which are beneath the portion of the fin 106 where the bottom side gate 128b is to be formed) may also be removed. Subsequently, the bottom side gate 128b may be formed.

In some embodiments, each of the top side gate 128a and the bottom side gate 128b may be formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. The gate electrode layer may be formed on the gate dielectric layer and may include at least one P-type workfunction metal or N-type workfunction metal, depending on whether the transistor is to be a p-type (e.g., PMOS) or an n-type (e.g., NMOS) transistor. In some implementations, the gate electrode layer may include a stack of two or more metal layers, where one or more metal layers are workfunction metal layers and at least one metal layer is a fill metal layer. Further metal layers may be included for other purposes, such as a barrier layer. For example, for a p-type transistor, metals that may be used for the gate electrode include, but are not limited to, ruthenium, palladium, platinum, cobalt, nickel, and conductive metal oxides, e.g., ruthenium oxide. A P-type metal layer may enable the formation of a p-type gate electrode with a workfunction that is between about 4.9 eV and about 5.2 eV. For an n-type transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer may enable the formation of an NMOS gate electrode with a workfunction that is between about 3.9 eV and about 4.2 eV.

In some embodiments, in the device 100g, the top side gate 128a and the bottom side gate 128b, in combination, forms a gate stack 128 for the component 100g. The component 100g comprises two stacked transistors. For example, a top transistor comprises the source region 120a, the top side gate 128a, and the drain region 121a; and a bottom transistor comprises the source region 120b, the bottom side gate 128b, and the drain region 121b. The source regions of the two transistors may be separated or isolated via the barrier layer 108. The drain regions of the two transistors may also be separated or isolated via the barrier layer 108. In some embodiments, the gates of the two transistors may be separated or isolated via the insulating layer 124. Thus, the barrier layer 108 facilitates formation of two stacked transistors on a top side and a bottom side of a fin, respectively.

FIG. 1G illustrate operations associated with a method for formation of a gate stack 128 from the sacrificial gate layer 112, e.g., by operations that are performed from a top side of the substrate 102. The gate stack 128 may be formed by appropriate manners as well. For example, FIGS. 4A-4D illustrate formation of the gate stack via a backside reveal process, according to some embodiments.

Figure 4A:
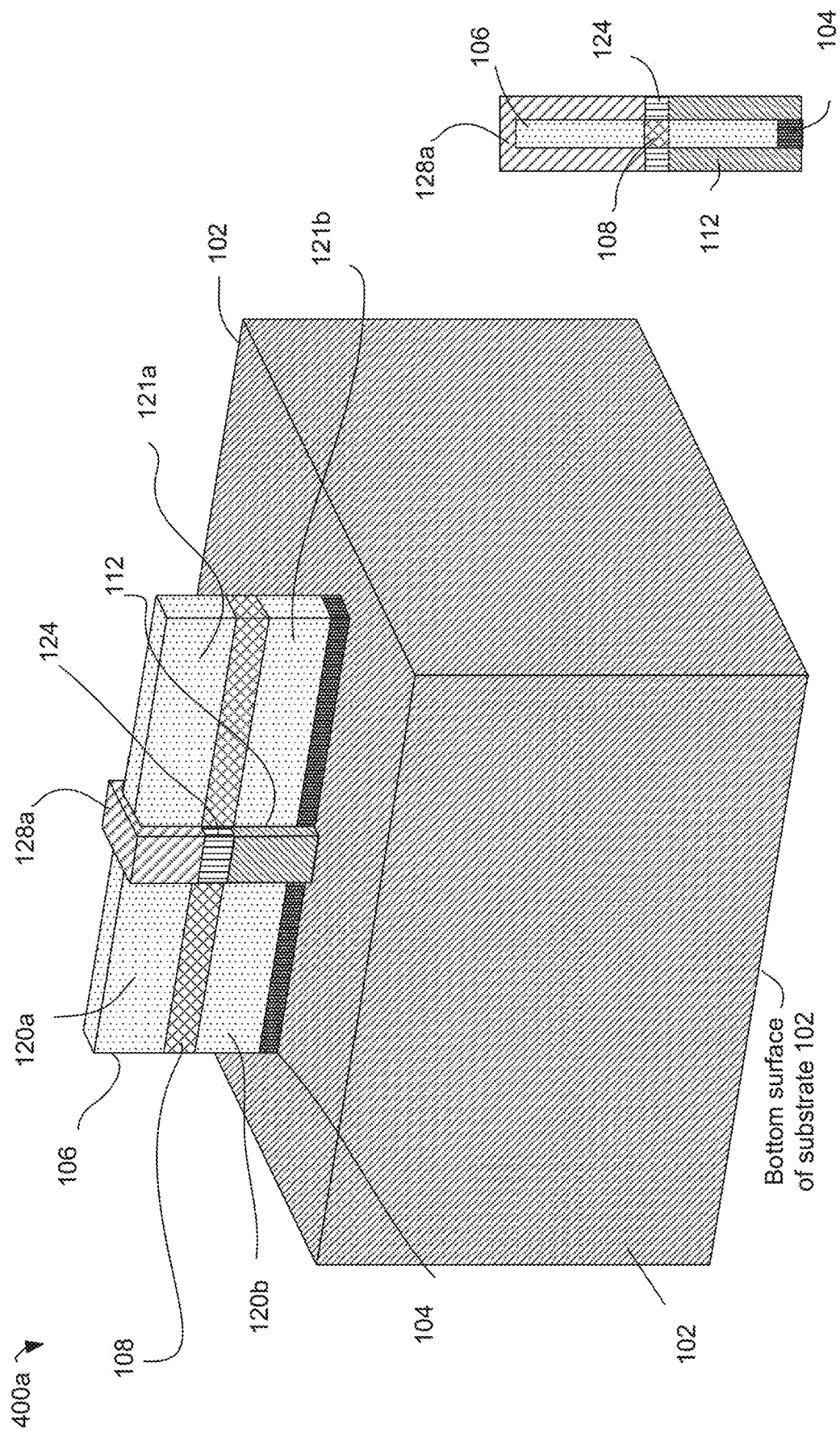

Referring to FIG. 4A, illustrated is a component 400a. The component 400a is similar to the component 100f of FIG. 1f, and hence, is not discussed in detail herein.

Figure 4B:
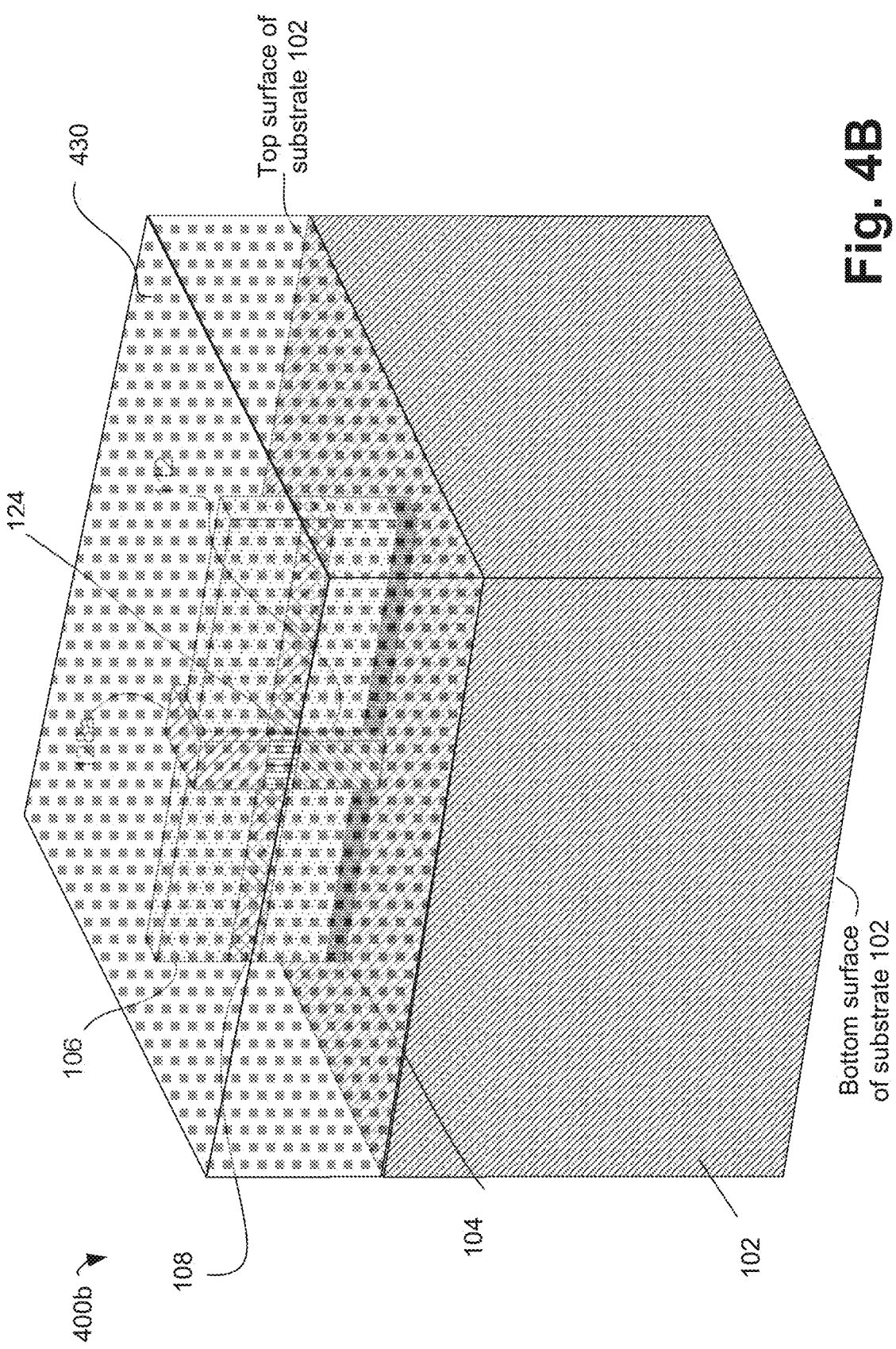

Referring to FIG. 4B, the top surface of the substrate 102, including the fin 106, the top side gate 128a, and the sacrificial gate layer 112, are encapsulated by an encapsulant 430 to form a component 400b. The encapsulant 430 is illustrated as being semi-transparent in FIG. 4B to illustrate the underlying elements—however, the encapsulant 430 is not necessarily transparent or semitransparent. In subsequent figures, the encapsulant 430 is illustrated as being opaque. In some embodiments, the encapsulant 430 may be formed of materials which may include, but not be limited to, an insulating material, a dielectric material, a gap fill material, silicon dioxide, silicon oxynitride, spin on silicon oxide, or similar materials.

Referring now to FIG. 4C, the component 400b (e.g., the substrate 102) may be front-side bonded to a carrier wafer, and the substrate 102 may be removed (e.g., via a combination of chemical and mechanical etching process) to form a component 400c. The component 400, thus, do not have the substrate 102, and illustrates the encapsulant 430, with surfaces of the sacrificial gate layer 112 and the sacrificial layer 104 exposed through the encapsulant 430. The top surface of the encapsulant 430 illustrated in FIG. 4C is actually the surface of the encapsulant 430 that was attached to the substrate 102 in FIG. 4B. The fin 106 is not visible in FIG. 4C, e.g., because the fin 106 is formed on the sacrificial layer 104, e.g., which is visible in this figure.

Although not illustrated in the figures, in some embodiments, the remaining section of sacrificial gate layer 112 is then selectively etched in the component 400c (e.g., via a combination of chemical and mechanical etching process). The etching may be designed to stop at or near the insulating layer 124. The etching may form a trench, which may be filed with permanent gate material to form a bottom side gate 428b of a component 400d of FIG. 4D.

Figure 4D:
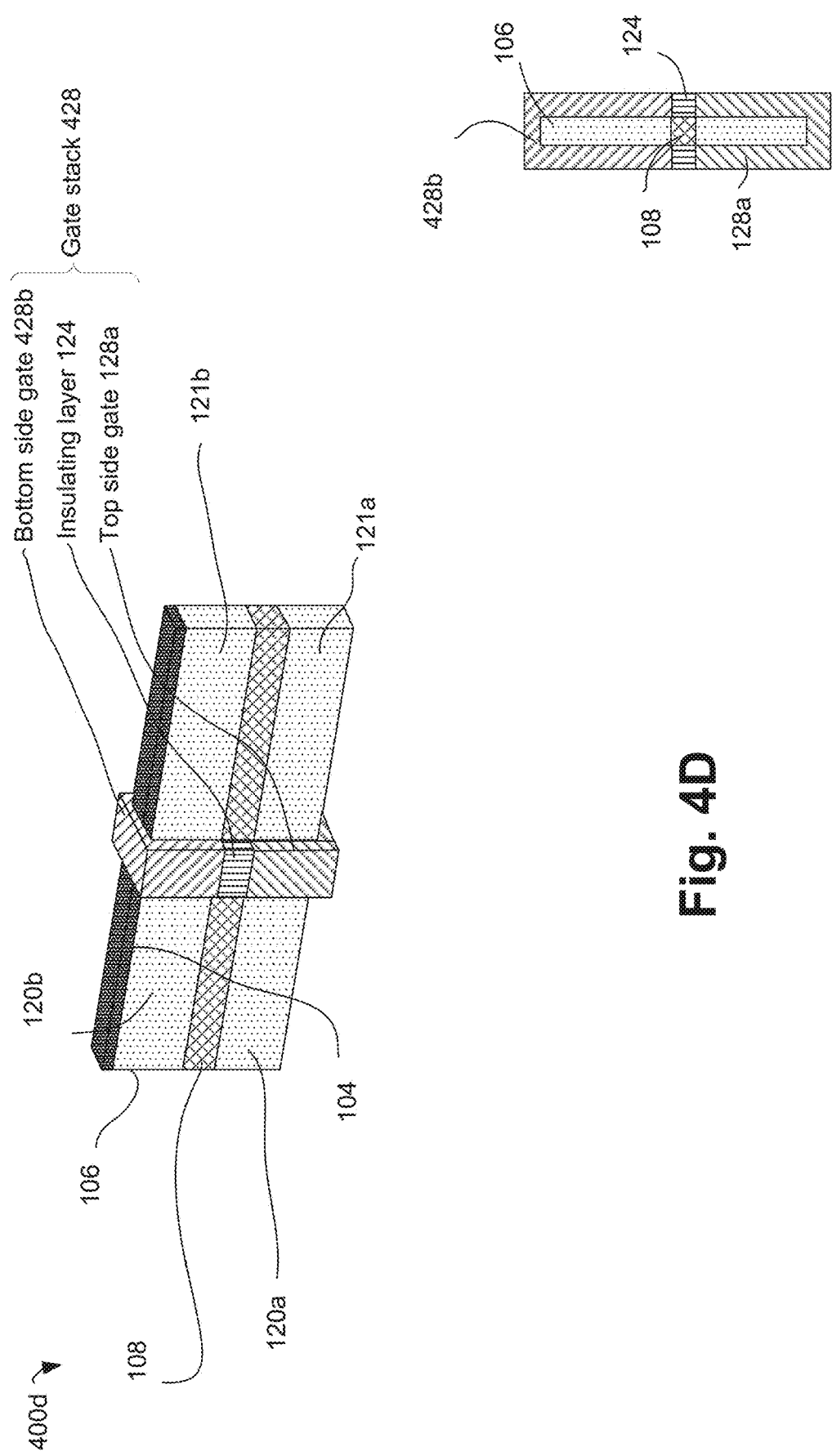

In some embodiments, the encapsulant 430 may be present in the component 400d, but the encapsulant 430 is not illustrated in FIG. 4D for purposes of illustrative clarity. In some other embodiments, the encapsulant 430 may even be removed while forming the component 400d.

Referring to FIG. 4D, the component 400d has the bottom side gate 428b formed by the backside reveal process, and the top side gate 128a (which was formed in FIG. 4A). In some embodiments, in the device 400d, the top side gate 128a and the bottom side gate 428b, in combination, forms a gate stack 428 for the component 400d.

The bottom side gate 428b of FIG. 4D and the bottom side gate 128b of FIG. 1G may be at least in part similar in structure (although the two bottom side gates may be formed by two different manners, as discussed), and the device 400d may be at least in part similar in structure to the device 100g (although, for example, the device 400d is illustrated upside-down compared to the device 100g; and the device 400d lacks the substrate 102 that may be present in the device 100g). Accordingly, the device 400d illustrated in FIG. 4D is not discussed in further detail herein.

As discussed with respect to FIG. 1G, each of the devices 100g and 400d of FIGS. 1G and 4D comprises two stacked transistors. For example, a first transistor comprises the source region 120a, the top side gate 128a, and the drain region 121a; and a bottom transistor comprises the source region 120b, the bottom side gate 428b (or the bottom side gate 128b), and the drain region 121b. The source regions of the two transistors may be separated or isolated via the barrier layer 108. The drain regions of the two transistors may also be separated or isolated via the barrier layer 108. In some embodiments, the gates of the two transistors may be separated or isolated via the insulating layer 124. Thus, the barrier layer 108 facilitates formation of two stacked transistors on a top side and a bottom side of a fin, respectively.

Figure 5A:
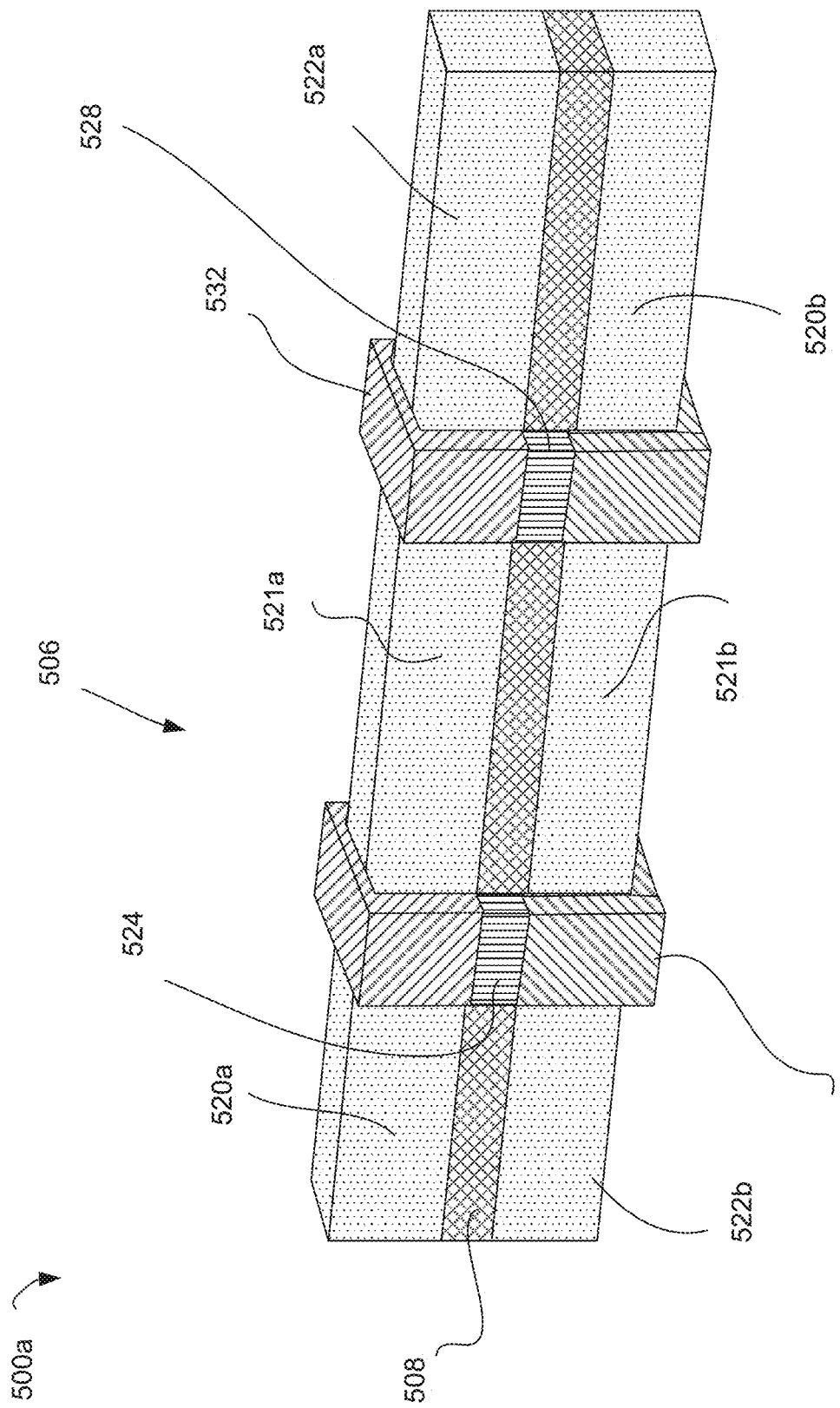
FIG. 5A illustrates a component comprising a fin with an electrostatic barrier layer, where four transistors are formed on the fin, according to some embodiments.

The principles of this disclosure may be applied to form multiple transistors on a fin. For example, FIG. 5A illustrates a component 500a comprising a fin 506 with an electrostatic barrier layer 508, where four transistors are formed on the fin 506, according to some embodiments. In some embodiments, the barrier layer 508 (e.g., which may be similar to the barrier layer 108 discussed herein) electrically divides the fin 506 in a top section and a bottom section. Two gate stacks, 530 and 532, may be formed on two respective regions of the fin 506. Each of the gate stacks 530 and 532 may be similar to the gate stacks 128 and/or 428 of FIGS. 1G and/or 4D. For example, the gate stacks 530 and 532 comprise insulating layers 524 and 528, respectively.

Identified in the fin 506 are various source regions 520a, 520b, drain regions 522a, 522b, and drain/source regions 521a, 521b, which may be formed by selective doping of the fin 506. In some embodiments, a first transistor comprises the source region 520a, the drain/source region 521a, and a top portion of the gate stack 530. In some embodiments, a second transistor comprises the drain/source region 521a, the drain region 522a, and a top portion of the gate stack 532. In some embodiments, a third transistor comprises the source region 520b, the drain/source region 521b, and a bottom portion of the gate stack 532. In some embodiments, a fourth transistor comprises the drain/source region 521b, the drain region 522b, and a bottom portion of the gate stack 530. Thus, four transistors are formed in the component 500a. In some embodiments, the first and second transistors are formed in series, and the third and fourth transistors are formed in series. Formation of the component 500a may be at least in part similar to the formation of the components 100g and/or 400d of FIGS. 1G and/or 4D, and hence, would not be discussed in further details herein.

Figure 5B:
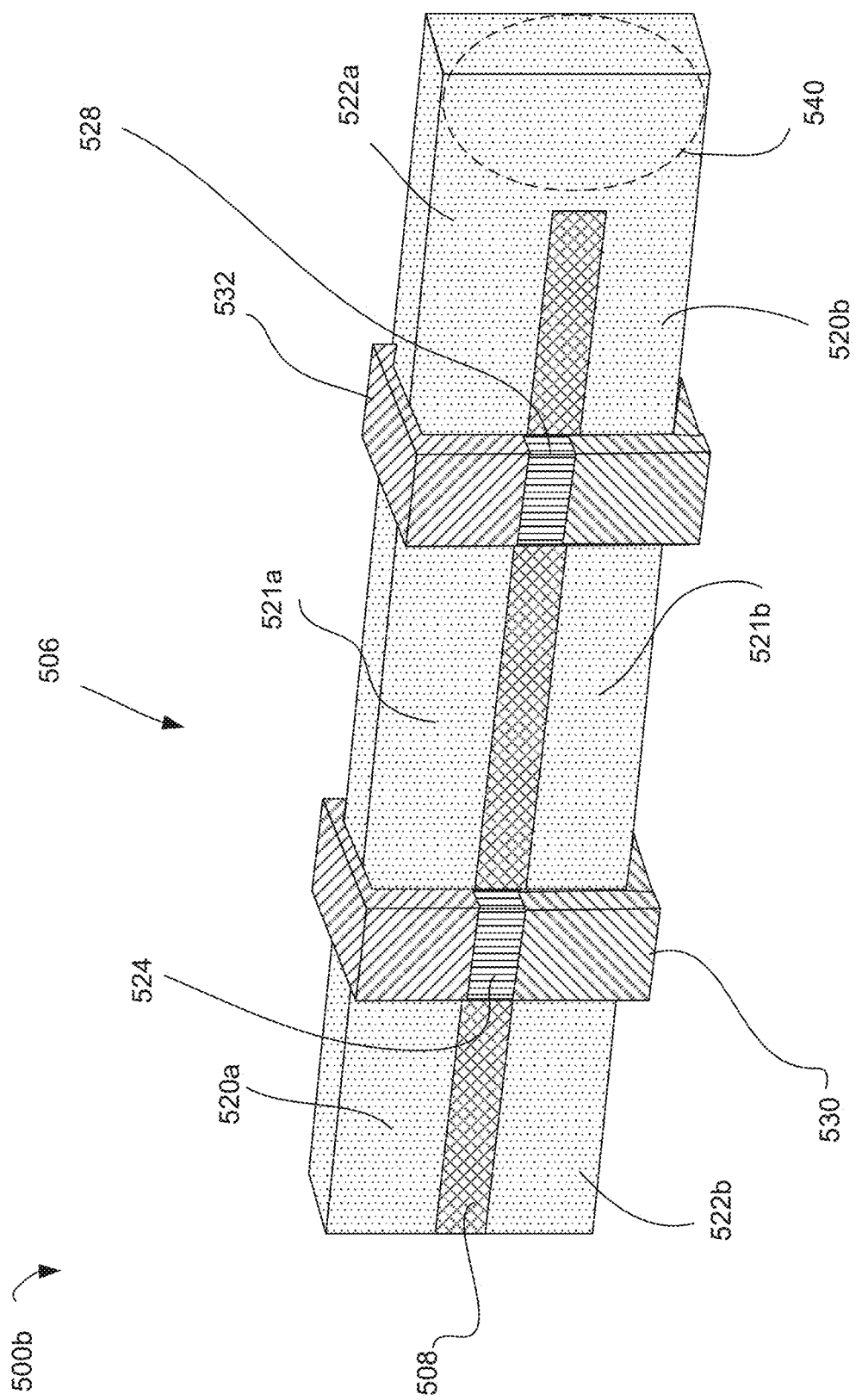
FIG. 5B illustrates a component comprising a fin with an electrostatic barrier layer having an opening, where four series connected transistors are formed on the fin, according to some embodiments.

As discussed with respect to FIG. 5A, four transistors are formed in the component 500a, where the first and second transistors are formed in series, and the third and fourth transistors are formed in series. Connection between various transistors may be configured, for example, by selectively patterning and removing the barrier layer 508. For example, FIG. 5B illustrates a component 500b comprising the fin 506 with the electrostatic barrier layer 508 having an opening, where four series connected transistors are formed on the fin 506, according to some embodiments. The component 500b of FIG. 5B is at least in part similar to the component 500a of FIG. 5A. However, unlike the component 500a, in the component 500b, the barrier layer 508 may not fully encircle the fin 506.

For example, no barrier layer may be present in a region 540, where the region 540 is identified using a dotted oval. In some embodiments, no barrier layer may be formed in the region 540. In some other embodiments, the barrier layer 508 may be initially formed in the region 540, and then patterned and selectively removed by etching or another appropriate means.

In some embodiments, in addition to (or instead of) the barrier layer 508 not being present in the region 540, the region 540 may be appropriately doped to cause a conductive path between the drain region 522a and the source region 520b. For example, such doping may be performed using ion implant, affixing a fixed charge, or the like (e.g., similar to formation of the barrier layer 508). The doping may be performed using an appropriate polarity such that the doping aids in conduction between the drain region 522a and the source region 520b. In some embodiments, such absence of the barrier layer 508 in the region 540 and/or such doping in the region 540 facilitates formation of a conductive path between the drain region 522a and the source region 520b, thereby connecting the above discussed four transistors in series.

There are many technical advantages of various embodiments. For example, conventional system allows formation of a transistor using only top-most portion of a fin. However, in various embodiments discussed herein, a vertical isolation in the fin (e.g., provided by the electrostatic barrier layer) allows introduction of devices both atop and below the same fin. This allows forming stacked devices on the same fin. In some embodiments, the stacked devices may also be interconnected, e.g., by patterning the electrostatic barrier layer and/or by appropriately doping the fin. Other technical effects will be evident from the various embodiments and figures.

Figure 6:
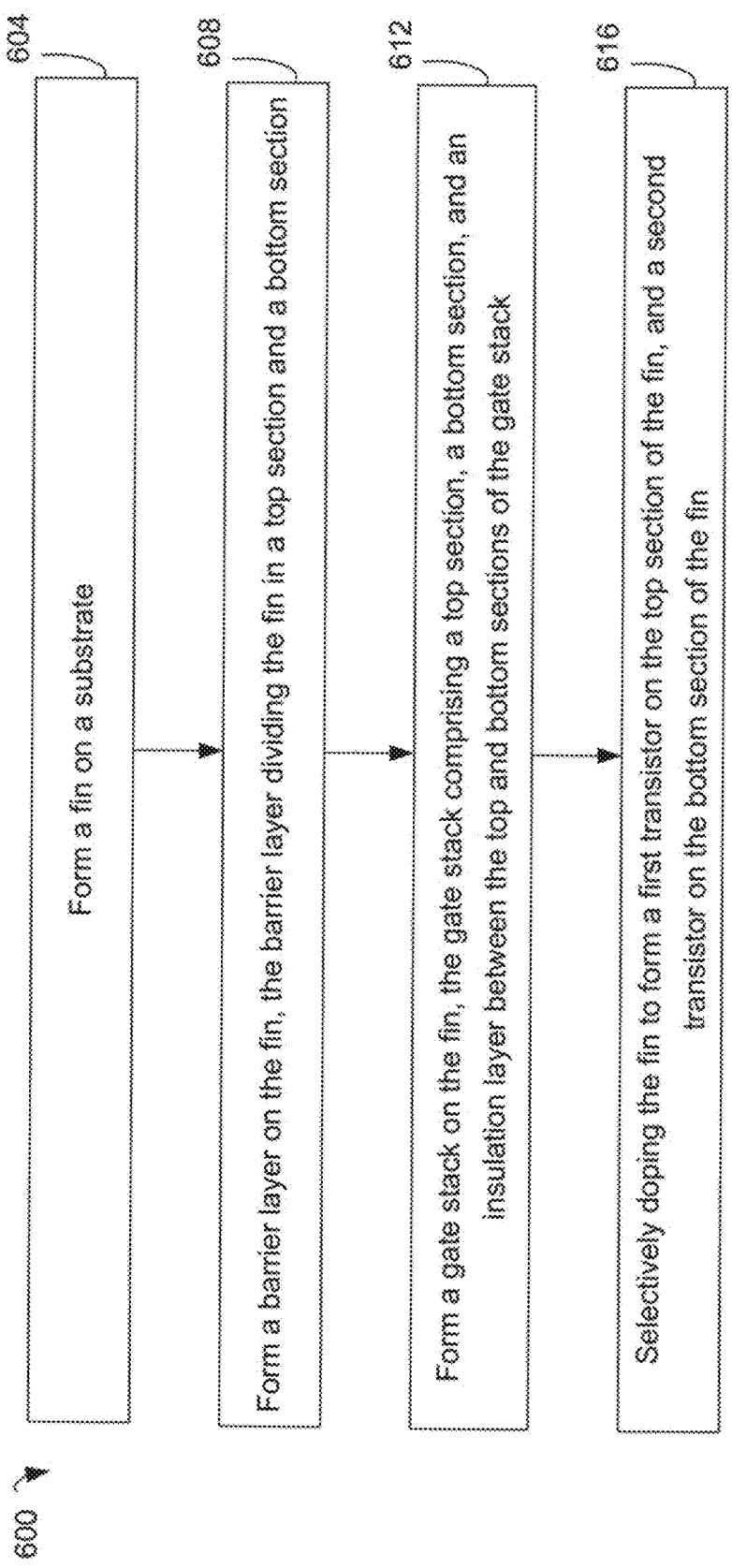
FIG. 6 illustrates a flowchart depicting a method for forming a device having a fin with an electrostatic barrier layer, where a first transistor is formed above the electrostatic barrier layer on the fin and a second transistor is formed below the electrostatic barrier layer on the fin, according to some embodiments.

FIG. 6 illustrates a flowchart depicting a method 600 for forming a device having a fin with an electrostatic barrier layer, where a first transistor is formed above the electrostatic barrier layer on the fin and a second transistor is formed below the electrostatic barrier layer on the fin, according to some embodiments. Although the blocks in the flowchart with reference to FIG. 6 are shown in a particular order, the order of the actions can be modified. Thus, the illustrated embodiments can be performed in a different order, and some actions/blocks may be performed in parallel. Some of the blocks and/or operations listed in FIG. 6 may be optional in accordance with certain embodiments. The numbering of the blocks presented is for the sake of clarity and is not intended to prescribe an order of operations in which the various blocks must occur.

At 604, a fin (e.g., the fin 106) may be formed on a substrate (e.g., the substrate 102). At 608, a barrier layer (e.g., the barrier layer 108) may be formed on the fin. The barrier layer may be formed using the operations discussed with respect to FIGS. 2A-2C, or FIGS. 3A-3E1. The barrier layer may divide the fin in a top section and a bottom section.

At 612, a gate stack (e.g., one of gate stacks 128, 428, 530, or 532) may be formed on the fin. The gate stack may comprise a top section, a bottom section, and an insulation layer between the top and bottom sections of the gate stack. The gate stack may be formed by front side operations (e.g., as discussed with respect to FIGS. 1C-1G) or via back-side reveal process (e.g., as discussed with respect to FIGS. 1C-1F and 4A-4D). At 616, the fin may be selectively doped to form a first transistor on the top section of the fin, and a second transistor on the bottom section of the fin.

Figure 7:
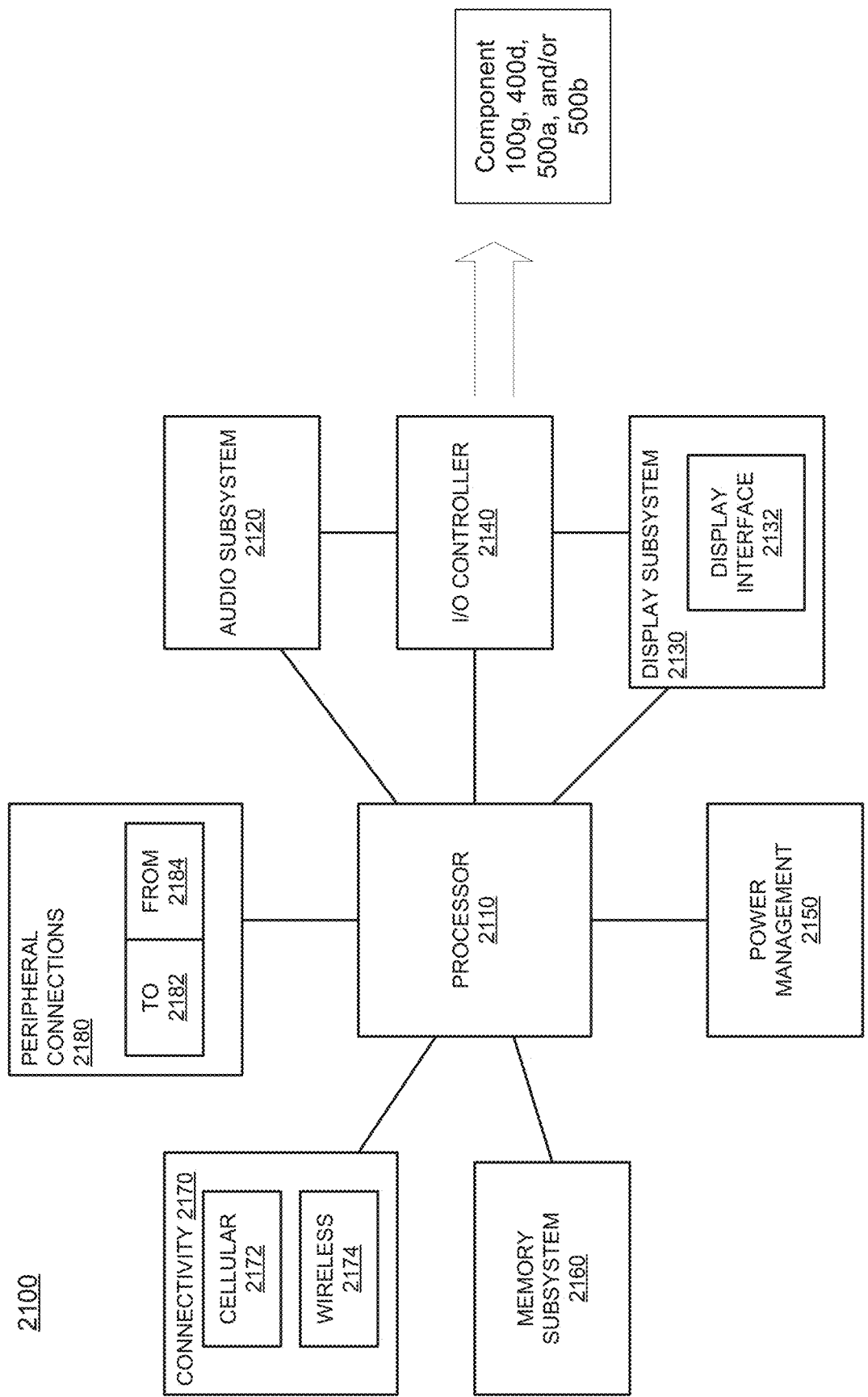
FIG. 7 illustrates a computer system, a computing device or a SoC (System-on-Chip), where one or more components of the computing device comprise a fin with an electrostatic barrier layer, where a first transistor is formed above the electrostatic barrier layer on the fin and a second transistor is formed below the electrostatic barrier layer on the fin, in accordance with some embodiments.

FIG. 7 illustrates a computer system, a computing device or a SoC (System-on-Chip) 2100, where one or more components of the computing device 2100 comprise a fin with an electrostatic barrier layer, where a first transistor is formed above the electrostatic barrier layer on the fin and a second transistor is formed below the electrostatic barrier layer on the fin, in accordance with some embodiments. It is pointed out that those elements of FIG. 7 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, one or more components of the computing device 2100 (e.g., the processor 2110, a memory in the memory subsystem 2160, and/or the like) comprises at least one component with a fin having an electrostatic barrier layer formed thereon, where the electrostatic barrier layer divides the fin a top section and a bottom section. A first transistor is formed on the top section of the fin, and a second transistor formed on the bottom section of the fin. For example, the component may be one of the components 100g, 400d, 500a and/or 500b. The component may be formed using various operations discussed herein in this disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

Clause 1. An apparatus comprising: a fin; a layer formed on the fin, the layer dividing the fin in a first section and a second section; a first device formed on the first section of the fin; and a second device formed on the second section of the fin.

Clause 2. The apparatus of clause 1, wherein: the layer is formed on a central region of the fin; and the layer includes one of Aluminum (Al), Silicon (Si), Oxygen (O), or Nitrogen (N), or a compound thereof.

Clause 3. The apparatus of clause 1, wherein the layer comprises dopant along a central region of the fin.

Clause 4. The apparatus of clause 3, wherein the dopant includes one of: Boron (B), Phosphorous (P), a compound thereof, boronsilicate glass (BSG), or phosphorus silicate glass (PSG).

Clause 5. The apparatus of any of clauses 1-4, wherein: the layer has an opening; and the first device is to be coupled to the second device through the opening in the layer.

Clause 6. The apparatus of clause 5, wherein: the layer comprises a first dopant on the fin; and the opening in the layer comprises a second dopant on the fin, wherein the first dopant is different from the second dopant.

Clause 7. The apparatus of any of clauses 1-6, further comprising: a gate stack disposed on the fin, wherein a first section of the gate stack is a first gate region for the first device, and wherein a second section of the gate stack is a second gate region for the second device.

Clause 8. The apparatus of clause 7, further comprising: a region that separates the first section of the gate stack and the second section of the gate stack, wherein the region comprises an insulating material.

Clause 9. The apparatus of clause 8, wherein the insulating material includes one of: silicon nitride, aluminum oxide, silicon carbide, silicon oxide.

Clause 10. The apparatus of any of clauses 7-9, wherein the gate stack is a first gate stack, and wherein the apparatus further comprises: a second gate stack disposed on the fin, wherein a first section of the second gate stack is a third gate region for a third device formed on the fin, and wherein a second section of the second gate stack is a fourth gate region for a fourth device formed on the fin.

Clause 11. The apparatus of any of clauses 1-5 and 7-10, wherein: a first region of the fin comprises first dopant, the first region of the fin being a first source region for the first device; a second region of the fin comprises second dopant, the second region of the fin being a first drain region for the first device; a third region of the fin comprises third dopant, the third region of the fin being a second source region for the second device; and a fourth region of the fin comprises fourth dopant, the fourth region of the fin being a second drain region for the second device.

Clause 12. A method comprising: forming a fin on a substrate; forming a layer on the fin, the layer dividing the fin in a first section and a second section; selectively doping the first section of the fin to form first one or more transistors on the first section of the fin; and selectively doping the second section of the fin to form second one or more transistors on the second section of the fin.

Clause 13. The method of clause 12, wherein forming the layer comprises: depositing a dielectric layer containing fixed charge along a central region of the fin to form the layer.

Clause 14. The method of clause 12, wherein forming the layer comprises: forming the layer by ion implantation along a central region of the fin.

Clause 15. The method of clause 12, wherein forming the layer comprises: depositing a film containing doping along a central region of the fin; and performing thermal anneal process to diffuse the doping from the film to the central region of the fin, thereby forming the layer.

Clause 16. The method of clause 15, wherein the film comprises one of: Boron (B), Phosphorous (P), Silicon (Si), a compound thereof, boronsilicate glass (BSG), or phosphorus silicate glass (PSG).

Clause 17. The method of any of clauses 12-16, further comprising: patterning the layer to form an opening in the layer, wherein one of the first one or more transistors is coupled to one of the second one or more transistors through the opening in the layer.

Clause 18. The method of clause 17, further comprising: doping the fin in the region of the opening to facilitate the coupling between the one of the first one or more transistors and the one of the second one or more transistors.

Clause 19. The method of any of clauses 12-18, further comprising: forming a gate stack on the fin, wherein a first section of the gate stack is a first gate region for a first transistor on the first section of the fin, and wherein a second section of the gate stack is a second gate region for a second transistor on the second section of the fin.

Clause 20. The method of clause 19, further comprising: forming a region that is to electrically insulate the first section of the gate stack from the second section of the gate stack.

Clause 21. The method of any of clauses 19-20, wherein the gate stack is a first gate stack, and wherein the method further comprises: forming a second gate stack on the fin, wherein a first section of the second gate stack is a third gate region for a third transistor formed on the first section of the fin, and wherein a second section of the second gate stack is a fourth gate region for a fourth transistor formed the second section of the fin.

Clause 22. The method of any of clauses 19-21, wherein forming the gate stack on the fin comprises: forming a sacrificial gate structure on the fin; replacing a first section of the sacrificial gate structure with the first section of the gate stack; and replacing a second section of the sacrificial gate structure with the second section of the gate stack.

Clause 23. The method of clause 22, wherein replacing the second section of the sacrificial gate structure with the second section of the gate stack comprises: encapsulating the fin and the sacrificial gate structure with an encapsulant, wherein the encapsulant, the fin and the sacrificial gate structure are formed on a substrate; removing, via a backside reveal process, the substrate to exposes a bottom surface of the second section of the sacrificial gate structure through the encapsulant; selectively etching the exposed second section of the sacrificial gate structure to form a trench within the encapsulant; and forming the second section of the gate stack within the trench.

Clause 24. A system comprising: a memory to store instructions; a processor coupled to the memory; and a wireless interface coupled to the processor, the wireless interface to transmit and receive signals wirelessly, wherein one of the memory or the processor comprises: a first transistor formed on a first section of a fin, and a second transistor formed on a second section of the fin.

Clause 25. The system of clause 24, further comprising: a layer formed on the fin, the layer dividing the first section and the second section of the fin.

Clause 26. The system of clause 25, wherein: the layer has an opening; and the first transistor is electrically coupled to the second transistor through the opening in the layer.

Clause 27. The system of any of clauses 25-26, wherein the layer is to at least in part isolate the first transistor from the second transistor.

Clause 28. An apparatus comprising: a fin; an electrostatic barrier layer formed on the fin, the electrostatic barrier layer dividing the fin in a top section and a bottom section; a first transistor formed on the top section of the fin; and a second transistor formed on the bottom section of the fin.

Clause 29. The apparatus of clause 28, wherein the electrostatic barrier layer comprises fixed charges deposited along a central region of the fin.

Clause 30. The apparatus of clause 28, wherein the electrostatic barrier layer is formed by ion implant along a central region of the fin.

Clause 31. The apparatus of any of clauses 28-30, wherein: the electrostatic barrier layer has an opening; and the first transistor is electrically coupled to the second transistor through the opening in the electrostatic barrier layer.

Clause 32. The apparatus of clause 31, wherein: the fin in the region of the opening is doped to facilitate the electrical coupling between the first transistor and the second transistor.

Clause 33. The apparatus of any of clauses 28-32, further comprising: a gate stack disposed on the fin, wherein a top section of the gate stack is a first gate region for the first transistor, and wherein a bottom section of the gate stack is a second gate region for the second transistor.

Clause 34. A method comprising: forming a fin on a substrate; forming a barrier layer on the fin, the barrier layer dividing the fin in a top section and a bottom section; forming a first section of a gate stack on the top section of the fin; and forming a second section of the gate stack on the bottom section of the fin.

Clause 35. The method of clause 34, further comprising: forming an insulating layer between the first section of the gate stack and the second section of the gate stack.

Clause 36. The method of any of clauses 34-35, further comprising: forming a first transistor on the top section of the fin, the first section of the gate stack acting as a gate region for the first transistor; and forming a second transistor on the bottom section of the fin, the second section of the gate stack acting as a gate region for the second transistor.

Clause 37. An apparatus comprising: means for forming a fin on a substrate; means for forming a layer on the fin, the layer dividing the fin in a first section and a second section; means for selectively doping the first section of the fin to form first one or more transistors on the first section of the fin; and means for selectively doping the second section of the fin to form second one or more transistors on the second section of the fin.

Clause 38. The apparatus of clause 37, wherein the means for forming the layer comprises: means for depositing a dielectric layer containing fixed charge along a central region of the fin to form the layer.

Clause 39. The apparatus of clause 37, wherein the means for forming the layer comprises: means for forming the layer by ion implantation along a central region of the fin.

Clause 40. The apparatus of clause 37, wherein the means for forming the layer comprises: means for depositing a film containing doping along a central region of the fin; and means for performing thermal anneal process to diffuse the doping from the film to the central region of the fin, thereby forming the layer.

Clause 41. The apparatus of clause 40, wherein the film comprises one of: Boron (B), Phosphorous (P), Silicon (Si), a compound thereof, boronsilicate glass (BSG), or phosphorus silicate glass (PSG).

Clause 42. The apparatus of any of clauses 37-41, further comprising: means for patterning the layer to form an opening in the layer, wherein one of the first one or more transistors is coupled to one of the second one or more transistors through the opening in the layer.

Clause 43. The apparatus of clause 42, further comprising: means for doping the fin in the region of the opening to facilitate the coupling between the one of the first one or more transistors and the one of the second one or more transistors.

Clause 44. The apparatus of any of clauses 37-43, further comprising: means for forming a gate stack on the fin; and means for wherein a first section of the gate stack is a first gate region for a first transistor on the first section of the fin, and wherein a second section of the gate stack is a second gate region for a second transistor on the second section of the fin.

Clause 45. The apparatus of clause 44, further comprising: means for forming a region that is to electrically insulate the first section of the gate stack from the second section of the gate stack.

Clause 46. The apparatus of any of clauses 44-45, wherein the gate stack is a first gate stack, and wherein the apparatus further comprises: means for forming a second gate stack on the fin, wherein a first section of the second gate stack is a third gate region for a third transistor formed on the first section of the fin, and wherein a second section of the second gate stack is a fourth gate region for a fourth transistor formed the second section of the fin.

Clause 47. The method of any of clauses 44-46, wherein the means for forming the gate stack on the fin comprises: means for forming a sacrificial gate structure on the fin; means for replacing a first section of the sacrificial gate structure with the first section of the gate stack; and means for replacing a second section of the sacrificial gate structure with the second section of the gate stack.

Clause 48. The apparatus of clause 47, wherein the means for replacing the second section of the sacrificial gate structure with the second section of the gate stack comprises: means for encapsulating the fin and the sacrificial gate structure with an encapsulant, wherein the encapsulant, the fin and the sacrificial gate structure are formed on a substrate; means for removing, via a backside reveal process, the substrate to exposes a bottom surface of the second section of the sacrificial gate structure through the encapsulant; means for selectively etching the exposed second section of the sacrificial gate structure to form a trench within the encapsulant; and means for forming the second section of the gate stack within the trench.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a fin;
    a layer on the fin, wherein the layer is to divide the fin in a first section and a second section, wherein the layer comprises a dopant along a central region of the fin and wherein the layer includes one of aluminum (Al), silicon (Si), oxygen (O), or nitrogen (N), or a compound thereof;
    a first device on the first section of the fin; and
    a second device on the second section of the fin.

2. The apparatus of claim 1, wherein the dopant includes one of: Boron (B), Phosphorous (P), a compound thereof, boronsilicate glass (BSG), or phosphorus silicate glass (PSG).

3. The apparatus of claim 2, wherein a magnitude of the dopant in the layer is between 5e17/cubic centimeter to 5e19/cubic centimeter.

4. The apparatus of claim 1, wherein:
the layer has an opening; and
the first device is to be coupled to the second device through the opening in the layer.

5. The apparatus of claim 4, wherein:
the dopant is a first dopant; and
the opening in the layer comprises a second dopant on the fin, wherein the first dopant is different from the second dopant.

6. The apparatus of claim 1, further comprising:
a gate stack on the fin,
wherein a first section of the gate stack is a first gate region for the first device, and
wherein a second section of the gate stack is a second gate region for the second device.

7. The apparatus of claim 6, further comprising:
a region that separates the first section of the gate stack and the second section of the gate stack, wherein the region comprises an insulative material.

8. The apparatus of claim 7, wherein the insulative material includes one of: Si, N, Al, or C.

9. The apparatus of claim 6, wherein the gate stack is a first gate stack, and wherein the apparatus further comprises:
a second gate stack on the fin,
wherein a first section of the second gate stack is a third gate region for a third device on the fin, and
wherein a second section of the second gate stack is a fourth gate region for a fourth device on the fin.

10. An apparatus comprising:
a fin;
a layer on the fin, wherein the layer is to divide the fin in a first section and a second section, and wherein the layer has an opening;
a first device on the first section of the fin; and
a second device on the second section of the fin, wherein the first device is coupled to the second device through the opening in the layer.

11. The apparatus of claim 10, wherein:
the layer is on a central region of the fin; and
the layer includes one of: Aluminum (Al), Silicon (Si), Oxygen (O), or Nitrogen (N), or a compound thereof.

12. The apparatus of claim 10, wherein the layer comprises dopant along a central region of the fin.

13. The apparatus of claim 12, wherein the dopant includes one of: Boron (B), Phosphorous (P), a compound thereof, boronsilicate glass (BSG), or phosphorus silicate glass (PSG).

14. The apparatus of claim 10, wherein:
the layer comprises a first dopant on the fin; and
the opening in the layer comprises a second dopant on the fin, wherein the first dopant is different from the second dopant.

15. The apparatus of claim 10, further comprising:
a gate stack on the fin,
wherein a first section of the gate stack is a first gate region for the first device, and
wherein a second section of the gate stack is a second gate region for the second device.

16. The apparatus of claim 15, further comprising:
a region that separates the first section of the gate stack and the second section of the gate stack, wherein the region comprises an insulative material.

17. The apparatus of claim 16, wherein the insulative material includes one of: Si, N, Al, or C.

18. The apparatus of claim 15, wherein the gate stack is a first gate stack, and wherein the apparatus further comprises:
a second gate stack on the fin,
wherein a first section of the second gate stack is a third gate region for a third device on the fin, and
wherein a second section of the second gate stack is a fourth gate region for a fourth device on the fin.

19. The apparatus of claim 10, wherein a magnitude of dopant in the layer is between 5e17/cubic centimeter to 5e19/cubic centimeter.

* * * * *

UNITED STATES PATENT AND TRADEMARK OFFICE
CERTIFICATE OF CORRECTION

PATENT NO. : 11,075,119 B2  
APPLICATION NO. : 16/475032  
DATED : July 27, 2021  
INVENTOR(S) : Lilak et al.

It is certified that error appears in the above-identified patent and that said Letters Patent is hereby corrected as shown below:

On the Title Page

Item (54) and in the Specification, Column 1, Line 1, In the Title, replace "VERTICALLY STACKED TRANSISTORS IN A PIN" with --VERTICALLY STACKED TRANSISTORS IN A FIN--

Signed and Sealed this  
Twenty-first Day of December, 2021

Drew Hirshfeld  
*Performing the Functions and Duties of the*  
*Under Secretary of Commerce for Intellectual Property and*  
*Director of the United States Patent and Trademark Office*